US006647642B2

(12) United States Patent
Kamikawa et al.

(10) Patent No.: US 6,647,642 B2
(45) Date of Patent: Nov. 18, 2003

(54) LIQUID PROCESSING APPARATUS AND METHOD

(75) Inventors: Yuji Kamikawa, Tosu (JP); Taichi Sakaguchi, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 39 days.

(21) Appl. No.: 10/014,604

(22) Filed: Dec. 14, 2001

(65) Prior Publication Data
US 2002/0073576 A1 Jun. 20, 2002

(30) Foreign Application Priority Data

Dec. 15, 2000 (JP) ........................................ 2000-381716

(51) Int. Cl.[7] ................................................. F26B 3/00
(52) U.S. Cl. .............................. 34/490; 34/381; 34/527; 34/232; 134/8; 134/61
(58) Field of Search ......................... 34/337, 339, 380, 34/381, 487, 490, 527, 83, 232; 134/8, 25.2, 61

(56) References Cited

U.S. PATENT DOCUMENTS

| | | | |
|---|---|---|---|
| 4,300,581 A | 11/1981 | Thompson | 134/57 |
| 5,022,419 A | 6/1991 | Thompson et al. | 134/102 |
| 5,678,320 A | 10/1997 | Thompson et al. | 34/58 |
| 5,784,797 A | 7/1998 | Curtis et al. | 34/58 |
| 5,863,348 A * | 1/1999 | Smith, Jr. et al. | 134/18 |
| 6,532,975 B1 * | 3/2003 | Kamikawa et al. | 134/61 |

FOREIGN PATENT DOCUMENTS

JP  2001-77075  3/2001

\* cited by examiner

Primary Examiner—Pamela A Wilson
(74) Attorney, Agent, or Firm—Smith, Gambrell & Russell, LLP

(57) ABSTRACT

A cleaning processing apparatus and method of wafers W held by a rotor capable of holding a plurality of wafers W, which is one embodiment of the liquid processing apparatus of the present invention, comprises an outside chamber, an inside chamber arranged slidable between a process position and a retreat position, and a cleaning mechanism for cleaning the inside chamber in the retreat position. The cleaning mechanism includes a cylindrical body arranged in the inside chamber so as to form a substantially cylindrical cleaning processing space between the inside chamber and the cylindrical body, a cleaning liquid spurting nozzle for spurting a cleaning liquid into the cleaning processing space, and a gas supply nozzle for supplying a predetermined drying gas into the cleaning processing space so as to make it possible to clean and dry the inside chamber.

17 Claims, 16 Drawing Sheets

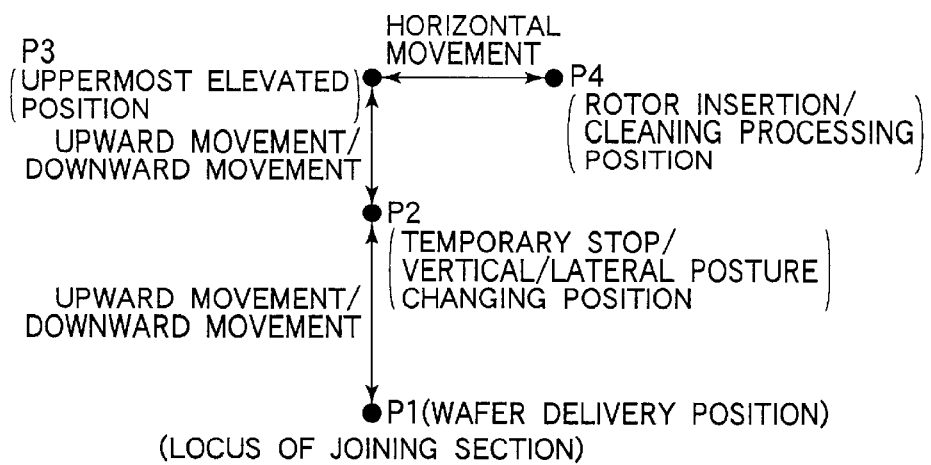
FIG.6A (LOCUS OF JOINING SECTION)
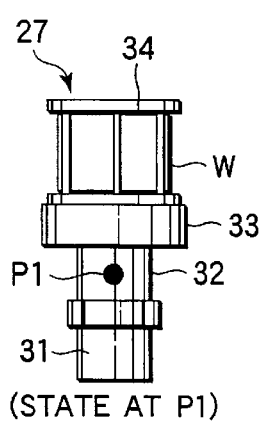
(STATE AT P1)
FIG.6B
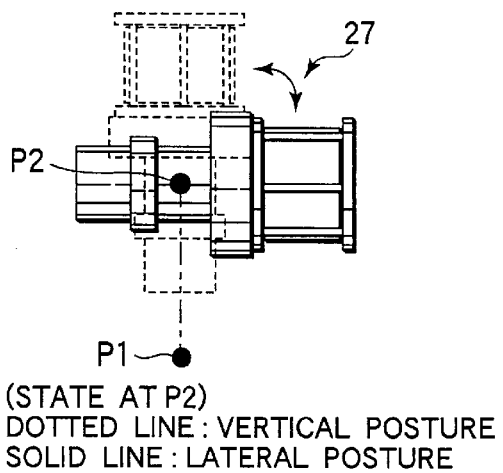
(STATE AT P2)
DOTTED LINE: VERTICAL POSTURE
SOLID LINE: LATERAL POSTURE
FIG.6C
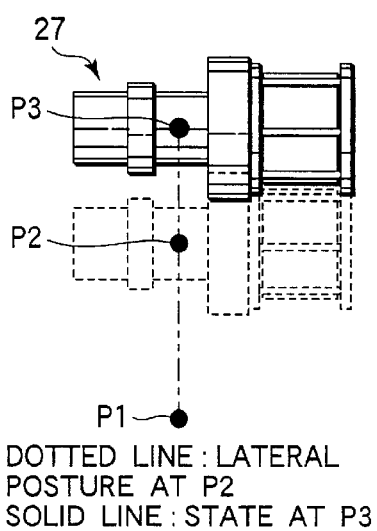
DOTTED LINE: LATERAL POSTURE AT P2
SOLID LINE: STATE AT P3
FIG.6D
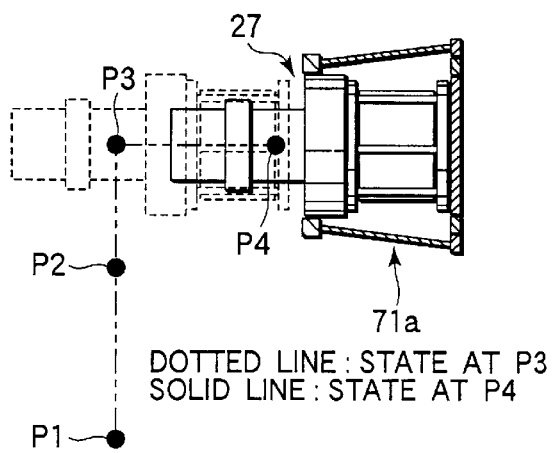
DOTTED LINE: STATE AT P3
SOLID LINE: STATE AT P4
FIG.6E

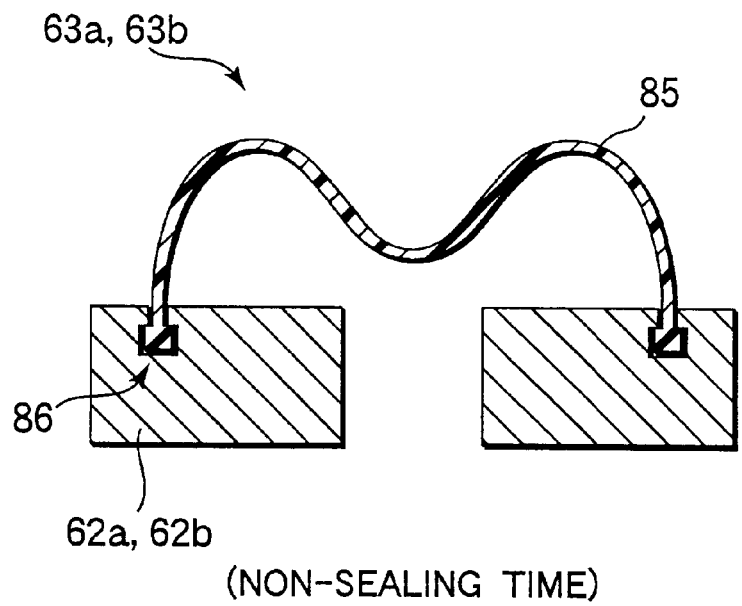
FIG.10A (NON-SEALING TIME)
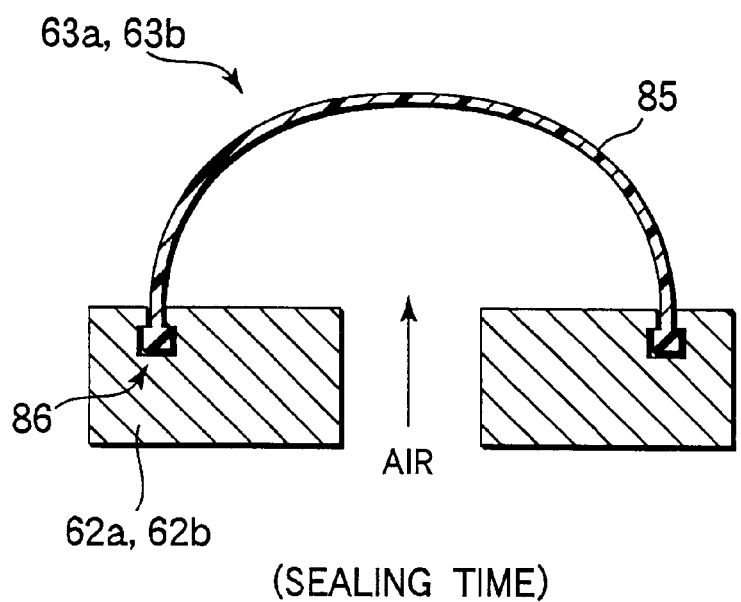
FIG.10B (SEALING TIME)

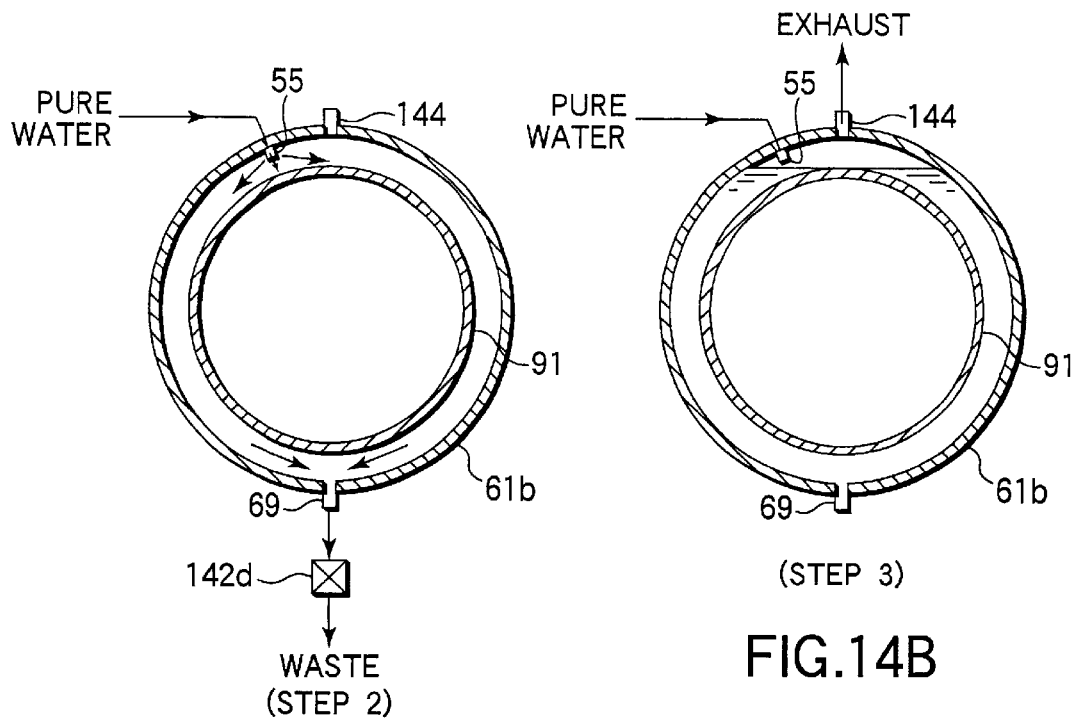
FIG.14A (STEP 2)
FIG.14B (STEP 3)
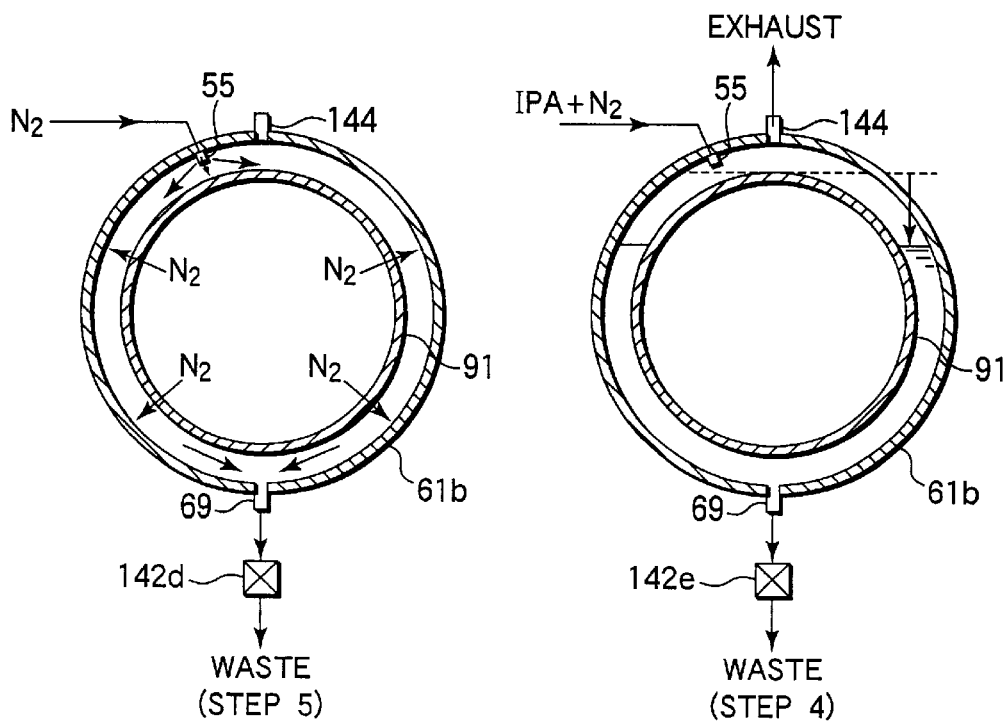
FIG.14D (STEP 5)
FIG.14C (STEP 4)

LIQUID PROCESSING APPARATUS AND METHOD

BACKGROUND OF THE INVENTION

1. Field of the Invention

The present invention relates to a liquid processing apparatus and a liquid processing method for applying a predetermined liquid processing or a predetermined drying processing to various substrates such as a semiconductor wafer and an LCD substrate.

2. Description of the Related Art

In the manufacturing process of, for example, a semiconductor device, used is a wafer cleaning apparatus for cleaning a semiconductor wafer used as a substrate with a cleaning liquid such as a predetermined chemical liquid or a pure water so as to remove contaminants such as particles, an organic contaminant, and metal impurities from the wafer or for drying the wafer by removing liquid droplets from the wafer by using an inert gas such as a nitrogen gas ($N_2$) or a volatile and highly hydrophilic IPA vapor.

Known is a cleaning-drying apparatus of this type, in which a plurality of wafers are subjected to the processing in a batch system. For example, a container housing a plurality of wafers such that the main surfaces of these wafers are held substantially parallel is disposed in a predetermined position of a cleaning-drying apparatus. The plural wafers housed in the container are simultaneously taken out by using a transfer mechanism so as to be transplanted onto a rotor for holding the wafers. Then, a predetermined liquid processing is applied to the wafers held by the rotor within a chamber, followed by applying a drying processing to these wafers. Finally, the wafers after the drying processing are transferred again into the container by using the transfer mechanism.

The process between the cleaning step and the drying step is carried out in general such that the chemical liquid used for the processing with the chemical liquid is washed away by using IPA, followed by applying a water cleaning processing using a pure water and subsequently applying a drying processing using an IPA gas or a nitrogen gas.

In recent years, there are increasing demands for omitting the step of washing away the chemical liquid with IPA so as to shorten the process step and, thus, to improve the throughput and for omitting the use of IPA so as to reduce the processing cost. However, the chemical liquid is left attached to, for example, the inner wall of the chamber after the processing with the chemical liquid. Also, the chemical liquid is not completely discharged after the processing with the chemical liquid so as to remain to some extent in the bottom portion of the chamber. If a water wash is applied under such a state after the processing with the chemical liquid, the chemical liquid is diluted with the pure water so as to form, for example, a strongly alkaline aqueous solution. If the strongly alkaline aqueous solution remains within the chamber for a considerably long time, the wafer tends to receive damage.

Also, the chamber forming the process space for applying a liquid processing has a sealing structure so as to prevent the process liquid from being scattered to the outside during the liquid processing. In general, a sealing material such as rubber is used for forming the sealing structure. It is necessary to renew the sealing material abruptly or periodically because the sealing material is deteriorated by, for example, the chemical liquid or is deteriorated with time. However, the conventional liquid processing apparatus is not sufficiently satisfactory in operability and maintenance capability. For example, it is necessary to detach the chamber itself for renewing the sealing material.

Further, it is required to maintain a high quality of the substrate and to improve the reliability of the substrate by decreasing the amount of the particles attached to the main surface of the substrate and by preventing the traces of the droplets of the chemical liquid from remaining on the main surface of the substrate during the processing with a chemical liquid and during the drying processing. However, the requirement has not yet been satisfied sufficiently.

BRIEF SUMMARY OF THE INVENTION

A first object of the present invention is to provide a liquid processing apparatus and a liquid processing method that prevent damage from being done to the substrate by the mixing of process liquids. A second object of the present invention is to provide a liquid processing apparatus that permits performing a liquid processing without using a process liquid used in the past as an intermediate liquid for preventing different process liquids from being mixed with each other. A third object of the present invention is to provide a liquid processing apparatus that facilitates the renewal of the sealing material and the maintenance. Further, a fourth object of the present invention is to provide a liquid processing apparatus capable of maintaining a high cleanliness on the main surface of the substrate and a liquid processing method using the particular liquid processing apparatus.

According to a first aspect of the present invention, there is provided a liquid processing apparatus for performing a liquid processing by supplying a process liquid to a plurality of substrates, comprising a rotor capable of holding said plural substrates a predetermined distance apart from each other, a chamber capable of housing said rotor and arranged slidable between a process position and a retreat position, a process liquid spurting nozzle for spurting said process liquid onto the substrates housed in said chamber, and a cleaning mechanism for cleaning said chamber, wherein said cleaning mechanism includes a process space-forming member positioned inside said chamber in its retreat position and forming a cleaning process space in the clearance between said chamber and said process space-forming member, a cleaning liquid spurting nozzle for spurting the cleaning liquid into said cleaning process space, and a gas spurting nozzle for spurting a drying gas into said cleaning process space.

According to a second aspect of the present invention, there is provided a liquid processing method for performing a liquid processing by supplying a process liquid to the substrates held by a rotor capable of holding a plurality of substrates a predetermined distance apart from each other by using a liquid processing apparatus including a fixed substantially cylindrical outside chamber, a substantially cylindrical inside chamber capable of being housed inside said outside chamber and slidable between a process position and a retreat position, and a cleaning mechanism for cleaning said inside chamber in its retreat position, said method comprising a first step for applying a liquid processing to said substrates by using said inside chamber in its process position, and a second step of applying a liquid processing to said substrates by using said outside chamber with said inside chamber by moving said inside chamber to its retreat position, and a third step of cleaning said inside chamber by said cleaning mechanism at a predetermined timing in its retreat position.

As described above, a cleaning mechanism of the chamber is utilized in the liquid processing apparatus and the liquid processing method of the present invention. This is advantageous in the case where the liquid processing is carried out by consecutively using a plurality of process liquids. Specifically, when it is undesirable for the process liquid used in the preceding stage to be mixed in a certain process liquid, it is possible to clean the chamber before the liquid processing is carried out by changing the process liquid. As a result, it is possible to prevent the process liquid from being contaminated so as to set forth the characteristics of the process liquid, leading to the liquid processing with a high accuracy. It follows that it is possible to maintain a high quality of the cleaned substrate.

Incidentally, in the case of using a chamber of a double wall structure comprising an inside chamber and an outside chamber, it is possible to carry out a liquid processing with a certain process liquid by using one of these chambers, followed by carrying out another liquid processing with another process liquid by using the other chamber. This makes it possible to prevent the different process liquids from being mixed with each other. It is also possible to improve the through-put. In this case, however, a new problem is generated that, in starting a liquid processing applied to substrates of another batch after completion of a series of processing applied to substrates of a certain batch, the chamber used first must be brought back to a clean state. It should be noted in this connection that the liquid processing apparatus of the present invention comprises a cleaning mechanism as pointed out above, making it possible to overcome the above-noted new problem generated by the use of a chamber having a double wall structure. As a result, it is possible to improve the through-put and to lower the processing cost.

According to a third aspect of the present invention, there is provided a liquid processing apparatus for performing a liquid processing by supplying a process liquid to the substrate, comprising a rotor for holding a plurality of substrates a predetermined distance apart from each other and in parallel; a substantially cylindrical outside chamber capable of housing said rotor and fixed to a process position; a substantially cylindrical inside chamber capable of housing said rotor, and capable of being housed in said outside chamber; a cylindrical body capable of being housed inside said inside chamber; a process liquid spurting nozzle for spurting a process liquid onto the substrate held by said rotor; a cleaning liquid spurting nozzle for spurting a cleaning liquid for cleaning said inside chamber; a first sliding mechanism capable of sliding said inside chamber among said process position, said retreat position, and a maintenance position remoter than said retreat position from said process position; a second sliding mechanism capable of sliding said cylindrical body between said retreat position and said maintenance position; a first seal mechanism mounted to one edge surface of said outside chamber in a manner to seal the clearance between said inside chamber and said outside chamber; and a second seal mechanism mounted to an edge surface of said inside chamber in a manner to seal the clearance between said cylindrical body and said inside chamber; wherein said inside chamber is slid between said process position and said maintenance position thereby being held at a predetermined position, and said cylindrical body is slid between said retreat position and said maintenance position thereby being held at a predetermined position, thereby gaining access easily to said first seal mechanism and said second seal mechanism.

In the cleaning processing apparatus of the construction described above, it is possible to gain access easily to the seal mechanism of the chamber. Therefore, it is possible to perform easily the renewing operation of the seal mechanism or the like in the event of, for example, leakage of a chemical liquid through the seal mechanism or in the periodic maintenance operation so as to shorten the working time.

According to a fourth aspect of the present invention, there is provided a liquid processing apparatus for applying a liquid processing by supplying a process liquid to a plurality of substrates, comprising a rotor capable of holding a plurality of substrates a predetermined distance apart from each other; a chamber including a tapered barrel portion, which is tapered such that the outer diameter at one edge surface is larger than that at the other edge surface, and arranged such that the bottom portion of said chamber has a predetermined gradient with said edge surface held substantially vertical; a gas/process liquid spurting nozzle for spurting a gas or a process liquid to the substrates held by said rotor; and an exhaust/drain mechanism mounted to the edge surface of said chamber having a longer outer diameter for exhausting said chamber and for draining the waste liquid from within said chamber; wherein said rotor is capable of being moved into and out of said chamber while holding the substrates substantially vertical such that the main processing surface of the substrate faces the edge surface of said chamber on the side of the longer outer diameter.

According to a fifth aspect of the present invention, there is provided a liquid processing method of a substrate using a liquid processing apparatus including a chamber having a tapered barrel portion, which is tapered such that the outer diameter at one edge surface is larger than that at the other edge surface, and having a predetermined gradient at the bottom portion with said edge surface held substantially vertical, a rotor capable of being moved into and out of said chamber and capable of holding substantially vertical a plurality of substrates a predetermined distance apart from each other in the horizontal direction, a rotating mechanism for rotating said rotor such that the substrates held by said rotor are allowed to rotate within a plane, a gas/process liquid spurting nozzle for spurting a gas or a process liquid onto the substrate held by said rotor, and an exhaust/drain mechanism mounted to the edge surface of said chamber on the side of the longer diameter for exhausting said chamber and for draining the waste liquid from within said chamber, wherein said rotor is arranged within said chamber such that the main processing surfaces of all the substrates held by said rotor are allowed to face the edge surface of said chamber on the side of the longer outer diameter thereby suppressing the stains on the main processing surfaces of said substrates.

According to the liquid processing apparatus and the liquid processing method of the particular construction, the gas and the process liquid spurted into the chamber are allowed to flow from the back surface of the substrate toward the main processing surface. It follows that, even where particles are carried by the gas stream, the particles are unlikely to be attached to the surface of the substrate so as to maintain a high cleanliness on the main processing surface of the substrate, thereby increasing the reliability of the product.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

FIG. 6 is for explaining the mode of movement of the rotor rotating mechanism;

FIGS. 10A and 10B is for explaining the state of the seal mechanism in the non-sealing time and in the sealing time;

FIGS. 14A to 14D is for explaining schematically the cleaning mode of the inside chamber;

DETAILED DESCRIPTION OF THE INVENTION

Some embodiments of the present invention will now be described in detail with reference to the accompanying drawings. The liquid processing apparatus of the present invention can be applied to a cleaning processing apparatus and a dry processing apparatus using various substrates as objects to be processed. In the embodiment of the present invention, a cleaning processing apparatus constructed to carry out consistently the transfer, cleaning and drying of a semiconductor wafer in a batch system is taken up as an example.

Figure 1:
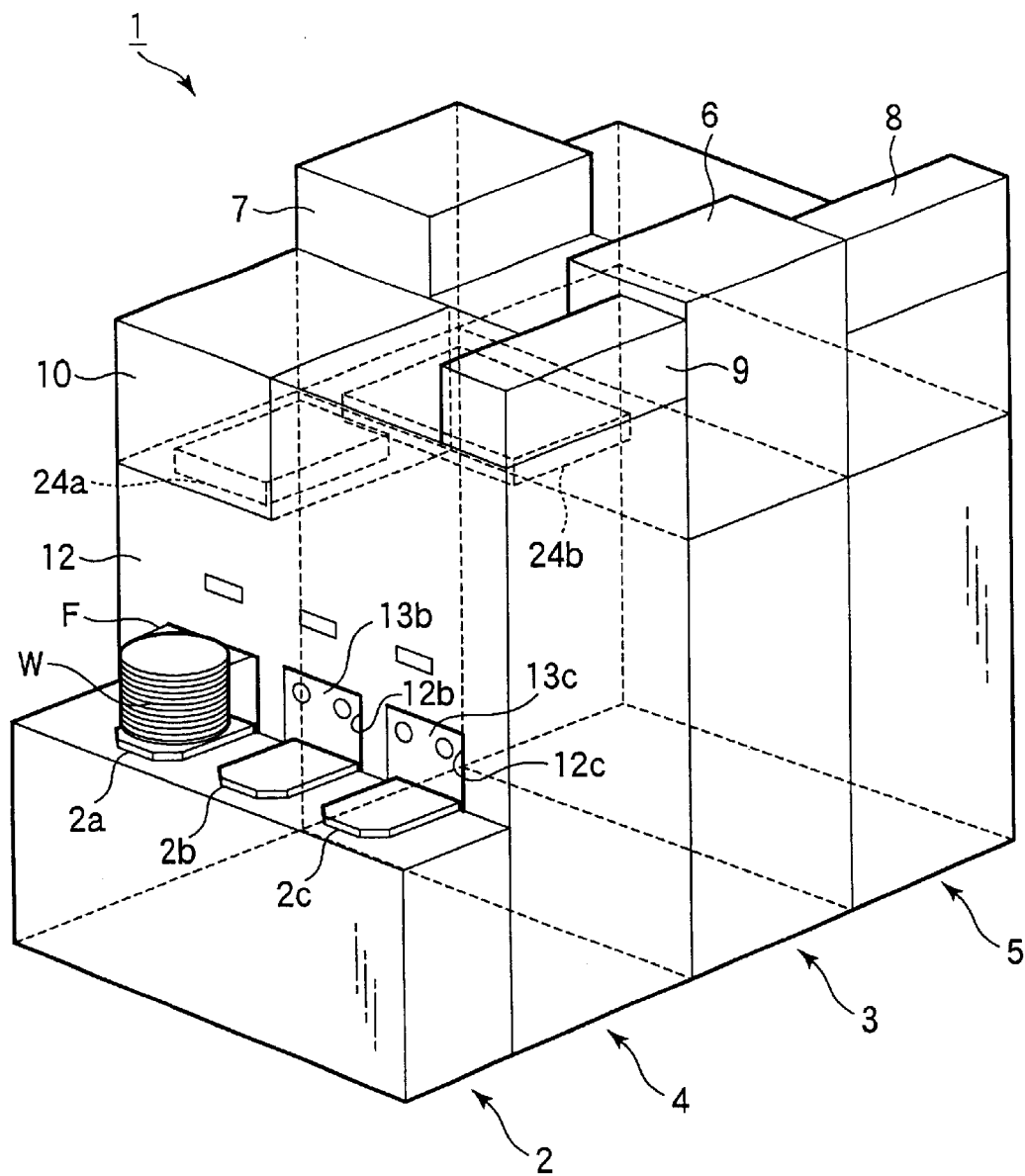
FIG. 1 is an oblique view showing a cleaning processing apparatus according to a first embodiment of the present invention.

FIG. 1 is an oblique view showing the outer appearance of a cleaning processing apparatus 1. As shown in FIG. 1, the cleaning processing 1 comprises mainly a FOUP delivery section 2 in which are arranged FOUP stages 2a to 2c for disposing thereon FOUPs (Front Opening Unified Pod) F each capable of housing a plurality of wafers W, a cleaning processing unit 3 for applying a cleaning processing to the wafer W, a wafer transfer unit 4 arranged between the FOUP delivery section 2 and the cleaning processing unit 3 for transferring the wafer W, and a chemical liquid storing unit 5 for storing a chemical liquid used for the cleaning processing.

A power source box 6 for the various electrically driven mechanisms and the electronic control device mounted to the cleaning processing apparatus 1 and a temperature control box 7 for controlling the temperature of each of the units constitutting the cleaning processing apparatus 1 are arranged in an upper portion of the cleaning processing unit 3. Also, a display box 9 for controlling the various display panels mounted to the cleaning processing apparatus 1 and a transfer mechanism control box 10 housing a control device of a wafer transfer mechanism 16 mounted to the wafer transfer unit 4 are arranged in an upper portion of the wafer transfer unit 4. Further, a heat exhaust box 8 for exhausting the heat exhaust collected from each box is arranged in an upper portion of the chemical liquid storing unit 5.

Figure 2:
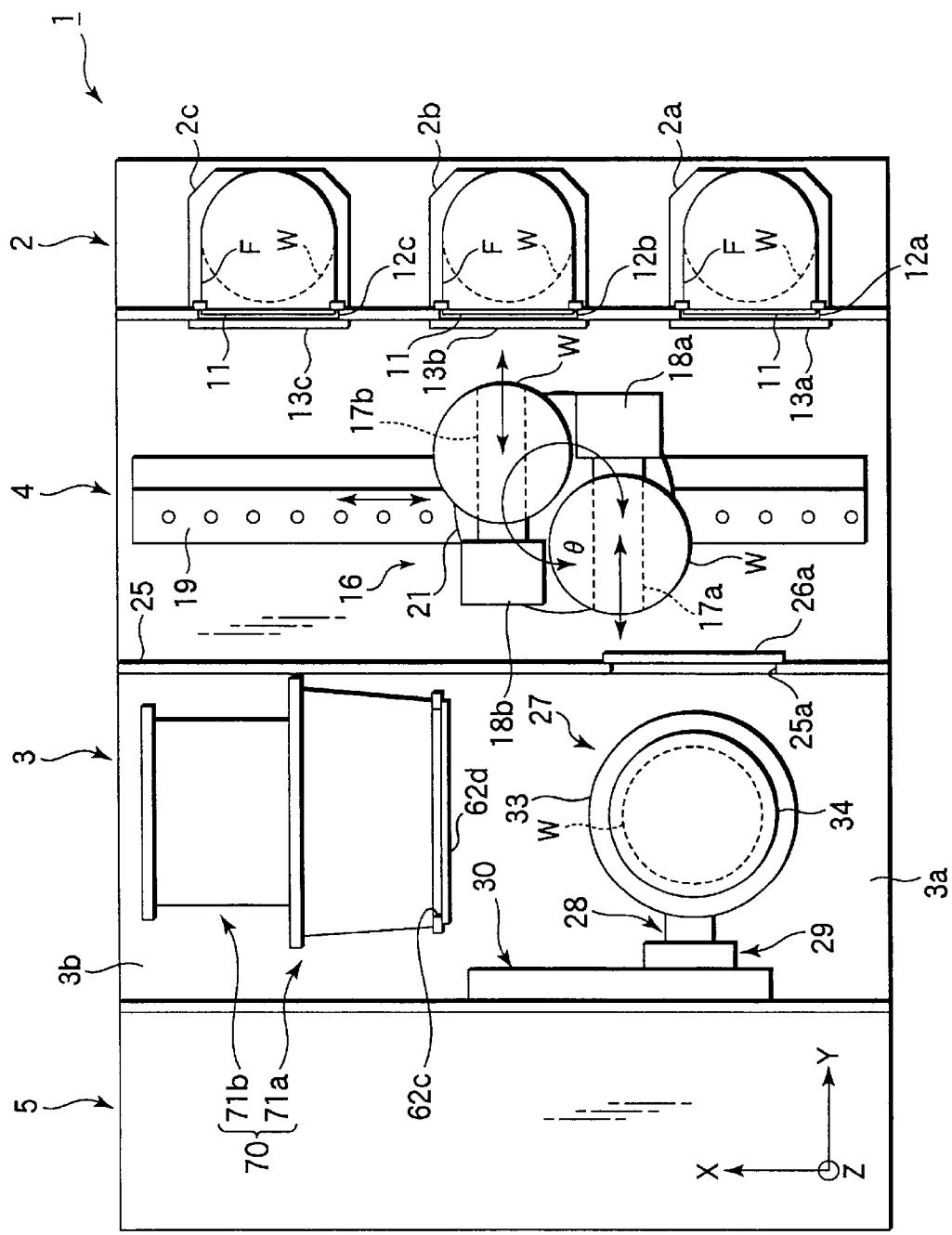
FIG. 2 is a plan view of the cleaning processing apparatus shown in FIG. 1.
Figure 3:
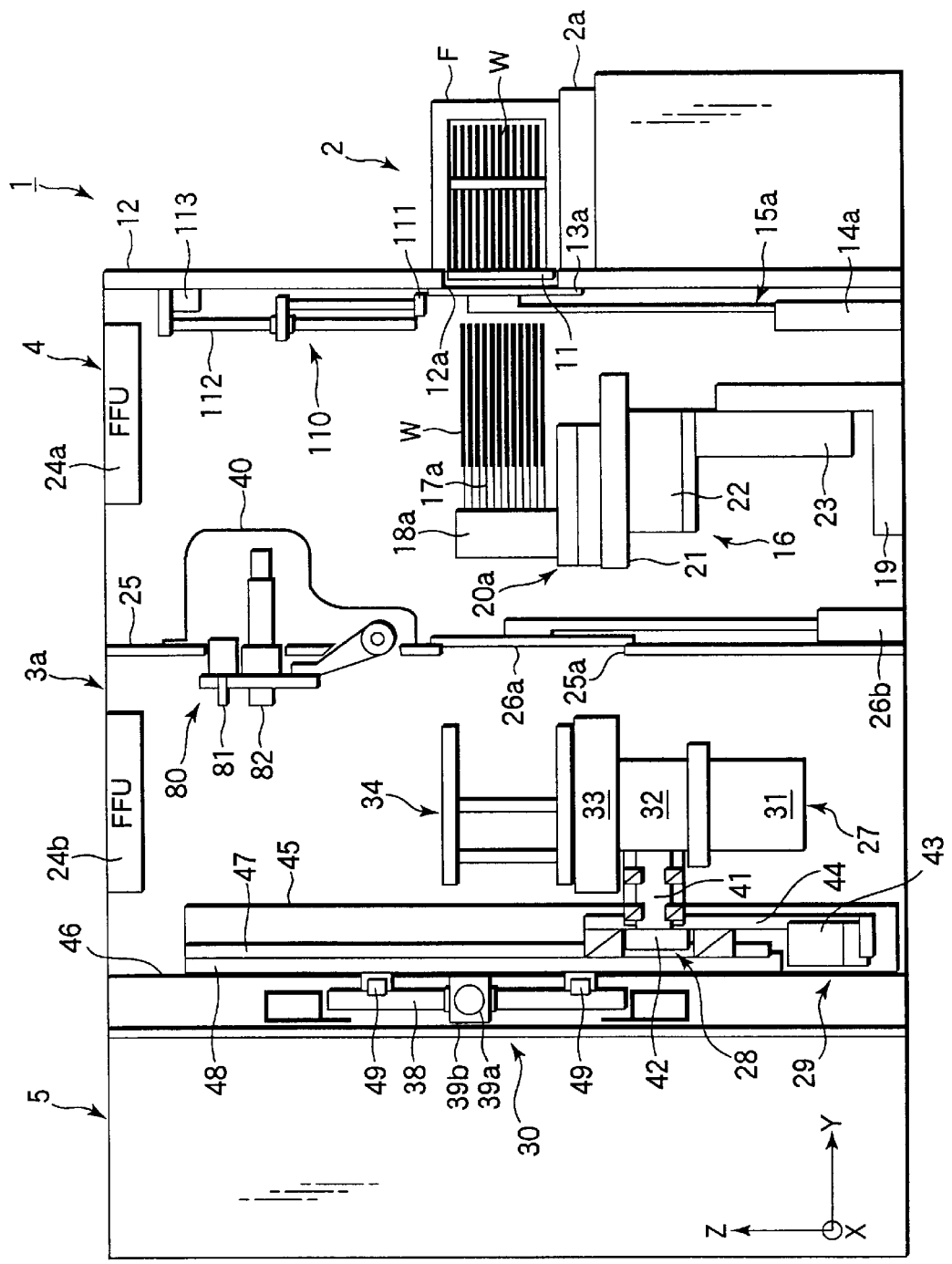
FIG. 3 is a side view of the cleaning processing apparatus shown in FIG. 1.
Figure 4:
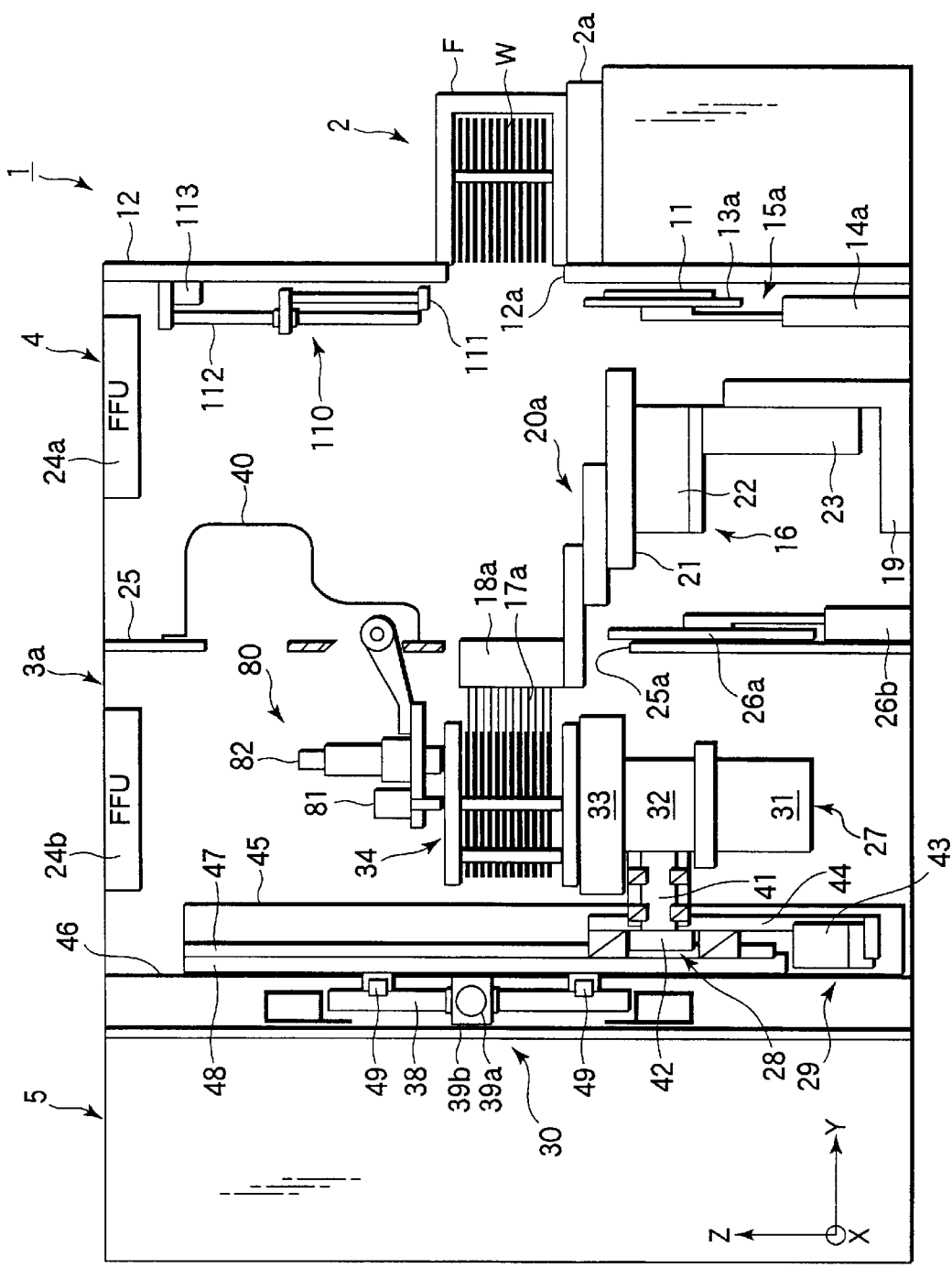
FIG. 4 is another side view of the cleaning processing apparatus shown in FIG. 1.

FIG. 2 is a plan view schematically showing the cleaning processing apparatus 1, and FIG. 3 is a side view schematically showing the cleaning processing apparatus 1. Further, FIG. 4 is a side view schematically showing the state that some of the driving mechanisms included in the schematic side view of FIG. 3 are driven. FIGS. 2 to 4 show only the FOUP delivery section 2, the cleaning processing unit 3, the wafer transfer unit 4 and the chemical liquid storing unit 5 while omitting the power source box 6 and various other box sections arranged in upper portions of the cleaning processing unit 3, the wafer transfer unit 4 and the chemical liquid storing unit 5. Also, as described herein later, the cleaning processing 3 is divided into a transfer section 3a and a cleaning section 3b. FIGS. 3 and 4 schematically show the construction of the transfer section 3a.

The FOUP F disposed on each of the FOUP stages 2a to 2c is capable of housing a plurality of wafers W, e.g., 25 wafers W, a predetermined distance apart from each other such that the main surface of the wafer W is held horizontal. A wafer delivery port through which the wafer W is put into and taken out of the FOUP F is formed in one side surface of the FOUP F. The FOUP F has a lid 11 for opening and closing the wafer delivery port of the FOUP F. The lid 11 can be mounted to and detached from the FOUP F by lid opening/closing mechanisms 15a to 15c described herein later.

Window portions 12a to 12c are formed in a boundary wall 12 between the wafer transfer unit 4 and the FOUP delivery section 2. The FOUPs F are disposed on the FOUP stages 2a to 2c such that the outer circumferential portion of the wafer delivery port formed in the FOUP F closes the window portions 12a to 12c, and that the lid 11 can be mounted to and detached from the FOUP F by the lid opening/closing mechanisms 15a to 15c (see FIG. 4).

The lid opening/closing mechanisms 15a to 15c including shutters 13a to 13c for opening/closing the window portions 12a to 12c and lift mechanisms 14a to 14c for vertically moving the shutters 13a to 13c are mounted to the window portions 12a to 12c inside the boundary wall 12 (on the side of the wafer transfer unit 4). The lid opening/closing mechanisms 15a to 15c include lid holding means such as a suction pad (not shown), making it possible to move vertically the lid 11 of the FOUP F together with the shutters 13a to 13c.

When the FOUP F is not disposed on any of the FOUP stages 2a to 2c, the shutters 13a to 13c are under the state of closing the window portions 12a to 12c so as to prevent the particles or the like from entering the wafer transfer unit 4 from the outside. On the other hand, when the wafer W is taken out of the FOUP F or put in the FOUP F, the shutters 13a to 13c and the lid 11 of the FOUP F are moved downward by the lid opening/closing mechanisms 15a to 15c so as to permit transfer picks 17a, 17b of a wafer transfer mechanism 16 described herein later to gain access to the FOUP F, thereby rendering open the window portions 12a to 12c.

Wafer inspecting mechanisms 110 for counting the number of wafers W within the FOUP F are arranged within the wafer transfer unit 4 adjacent to the lid opening/closing mechanisms 15a to 15c. The wafer inspecting mechanism 110 includes a reflection type optical sensor 111 having, for example, a signal transmitting section and a signal receiving section using an infrared ray laser. While scanning the reflection type optical sensor 111 in a Z-direction (vertical direction) along a guide 112 by using a motor 113, an infrared ray laser is oscillated toward the wafer W and the light reflected from the edge surface of the wafer W is received. As a result, it is possible to inspect the number of wafers W housed in the FOUP F and the housed state of the wafers W. For example, it is possible to inspect whether the wafers W are housed substantially in parallel at a predetermined pitch, whether two wafers W are housed in an overlapped state, whether the wafers W are housed obliquely in different wafer holding stages, and whether the wafers W are projected out of the predetermined positions within the FOUP F.

Incidentally, if the wafer inspecting mechanism 110 is mounted to the wafer transfer mechanism 16 so as to permit the wafer inspecting mechanism 110 to be movable together with the wafer transfer mechanism 16, it suffices to arrange only one wafer inspecting mechanism 110. It is also possible to arrange separately, for example, a sensor for confirming the number of wafers housed in the FOUP F and a sensor for inspecting the housed state of the wafer W. Further, it is possible to mount the wafer inspecting mechanism 110 to the lid opening/closing mechanisms 15a to 15c.

A filter fan unit (FFU) 24a for blowing a clean air into the wafer transfer unit 4 is arranged in the ceiling portion of the wafer transfer unit 4. Under the state that the window portions 12a to 12c are left open, a portion of the clean air flowing downward from the FFU 24a flows to the outside through the window portions 12a to 12c so as to flow into the FOUPs F disposed on the FOUP stages 2a to 2c. Since a clean air is supplied onto the wafers W housed in the FOUP F, particles are prevented from being attached to the wafers W. Incidentally, it is possible to destaticize the wafer W by mounting an ionizer (not shown) in a lower portion of the FFU 24a.

The wafer transfer mechanism 16 is arranged within the wafer transfer unit 4. The wafer transfer mechanism 16 includes a linear driving mechanism 19 provided with a guide extending in an X-direction, transfer picks 17a, 17b for holding the wafer W, holding sections 18a, 18b for holding the transfer picks 17a, 17b, respectively, sliding mechanisms 20a, 20b having the transfer picks 17a, 17b and the holding sections 18a, 18b mounted thereto, respectively, a rotatable table 21 having the sliding mechanisms 20a, 20b mounted thereto, a rotary mechanism 22 for rotating the table 21, and a lift mechanism 23 for vertically moving the portion above the rotary mechanism 22.

Since the two systems of the transfer picks 17a, 17b are mounted to the wafer transfer mechanism 16, it is possible to use the transfer pick 17a for transferring the unprocessed wafer W and to use the transfer pick 17b for transferring the wafer W after the cleaning processing. In this case, it is possible to prevent effectively the situation that the particles or the like attached to the unprocessed wafer W are attached to the transfer pick and, then, to the processed wafer W, compared with the case where, for example, the transfer pick of only one system is mounted to the wafer transfer mechanism. Also, by arranging the transfer picks of the two systems, it is possible to deliver the unprocessed wafer immediately after receipt of the processed wafer from the cleaning processing unit 3.

A single transfer pick 17a transfers a single wafer W. In order to transfer simultaneously the 25 wafers housed in the FOUP F, 25 transfer picks 17a are held by the holding section 18a substantially in parallel a predetermine distance apart from each other. Likewise, 25 transfer picks 17b are held by the holding section 18b substantially in parallel a predetermined distance apart from each other.

In performing the wafer delivery between the FOUP F or a rotor 34 described herein later and the transfer picks 17a, 17b, it is necessary move the transfer picks 17a, 17b in a vertical direction by a predetermined distance. The vertical movement of the transfer picks 17a, 17b can be performed by the lift mechanism 23. Incidentally, it is possible to mount separately a lift mechanism for vertically moving the transfer picks 17a, 17b to the holding sections 18a, 18b.

The transfer picks 17a, 17b can be slid together with the holding sections 18a, 18b by the sliding mechanisms 20a, 20b in the longitudinal direction of the transfer picks 17a, 17b. Also, the table 21 can be rotated by the rotary mechanism 22 within a horizontal plane (θ-direction shown in FIG. 2). Further, the height of the transfer picks 17a, 17b can be adjusted by the lift mechanism 23, and can be moved in the X-direction together with the lift mechanism 23, etc. by a linear driving mechanism 19. As result, the transfer picks 17a, 17b are enabled to gain access to the FOUPs F disposed on any of the FOUP stages 2a to 2c and to the rotor 34. It follows that the wafer W can be transferred in a horizontal state between the FOUP F disposed on any of the FOUP stages 2a to 2c and the rotor 34.

For example, where the unprocessed wafer W is transferred from the FOUP F disposed on the FOUP stage 2b into the rotor 34 arranged in the cleaning processing unit 3 by using the transfer pick 17a, the linear driving mechanism 19 is driven first so as to move the transfer pick 17a in the X-direction such that the transfer pick 17a is capable of gaining access to the FOUP F disposed on the FOUP stage 2b. Then, the lift mechanism 23 is driven so as to adjust the height of the transfer pick 17a, followed by operating the sliding mechanism 20a so as to slide the transfer pick 17a and the holding section 18a toward the FOUP stage 2b. Further, the transfer pick 17a and the holding section 18a are brought back to the original positions by allowing the transfer pick 17a to hold the wafer W so as to take the wafer W out of the FOUP F.

In the next step, the linear driving mechanism 19 is driven while operating the rotary mechanism 22 to swing the table 21 by 180° so as to allow the transfer pick 17a to be ready for gaining access to the rotor 34. Further, the transfer pick 17a and the holding section 18a are slid toward the rotor 34 so as to deliver the wafer W into the rotor 34 (see FIG. 4), and the transfer pick 17a and the holding section 18a are brought back again to the original positions so as to finish transfer of the wafer W into the rotor 34.

In the wafer transfer mechanism 16, the transfer picks 17a and 17b are arranged in symmetry with respect to the center of rotation of the table 21. Therefore, if the table 21 is swung under the state that the sliding mechanisms 20a, 20b are not elongated, it is possible to narrow the range of the locus of movement of the transfer picks 17a, 17b during the swinging operation of the these transfer picks 17a, 17b even under the state that the transfer picks 17a, 17b hold the wafers W. It follows that the space of the wafer transfer unit 4 is diminished in the cleaning processing apparatus 1 of the present invention.

A window portion 25a for transferring the wafer W is formed in a boundary wall 25 forming a partition between the wafer transfer unit 4 and the cleaning processing unit 3. The window 25a is opened or closed by a shutter 26a that can be vertically moved by a lift mechanism 26b. The shutter 26a is arranged on the side of the wafer transfer unit 4. However, it is also possible to arrange the shutter 26a on the side of the cleaning processing unit 3. The wafer W is transferred between the wafer transfer unit 4 and the cleaning processing unit 3 through the window portion 25a.

Incidentally, the atmosphere within the wafer transfer unit 4 can be separated from the atmosphere within the cleaning processing unit 3 by the shutter 26a. Therefore, even where, for example, the cleaning liquid is scattered within the cleaning processing unit 3 or the vapor of the cleaning liquid is diffused, it is possible to prevent the contamination caused by the scattering or diffusion of the cleaning liquid from being expanded into the wafer transfer unit 4.

The cleaning processing unit 3 includes a transfer section 3a and a cleaning section 3b. A filter fan unit (FFU) 24b is arranged in the ceiling portion of the transfer section 3a so as to blow a clean air having particles removed therefrom into the transfer section 3a. It is possible to arrange an ionizer (not shown) in a lower portion of the FFU 24b so as to destaticize the wafer W.

Arranged within the transfer section 3a are a rotor rotating mechanism 27, a posture changing mechanism 28 for controlling the posture of the rotor rotating mechanism 27, a Z-axis linear driving mechanism 29 for vertically moving the rotor rotating mechanism 27 and the posture changing mechanism 28, an X-axis linear driving mechanism 30 for moving the Z-axis linear driving mechanism 29 in the horizontal direction, a cover 45 serving to prevent the particles generated from the posture changing mechanism 28 and the Z-axis linear driving mechanism 29 from being scattered toward the rotor rotating mechanism 27 so as to be attached to the wafer W, and a cover 46 serving to prevent the particles generated from the X-axis linear driving mechanism 30 from being scattered toward the rotor rotating mechanism 27 so as to be attached to the wafer W.

The rotor rotating mechanism 27 includes the rotor 34 capable of holding the wafers W a predetermined distance apart from each other, a motor (rotating mechanism) 31 for rotating the rotor 34 such that the wafers W held by the rotor 34 are allowed to make a planar rotation, a joining section 32 to the posture changing mechanism 28, a lid 33 serving to close a rotor delivery port 62a formed in an outside chamber 71a when the rotor 34 is inserted into the outside chamber 71a, and a rotary shaft 50 (see FIGS. 5, 7 and 8) extending through the joining section 32 and the lid 33 so as to join the rotor 34 to the motor 31.

Figure 5:
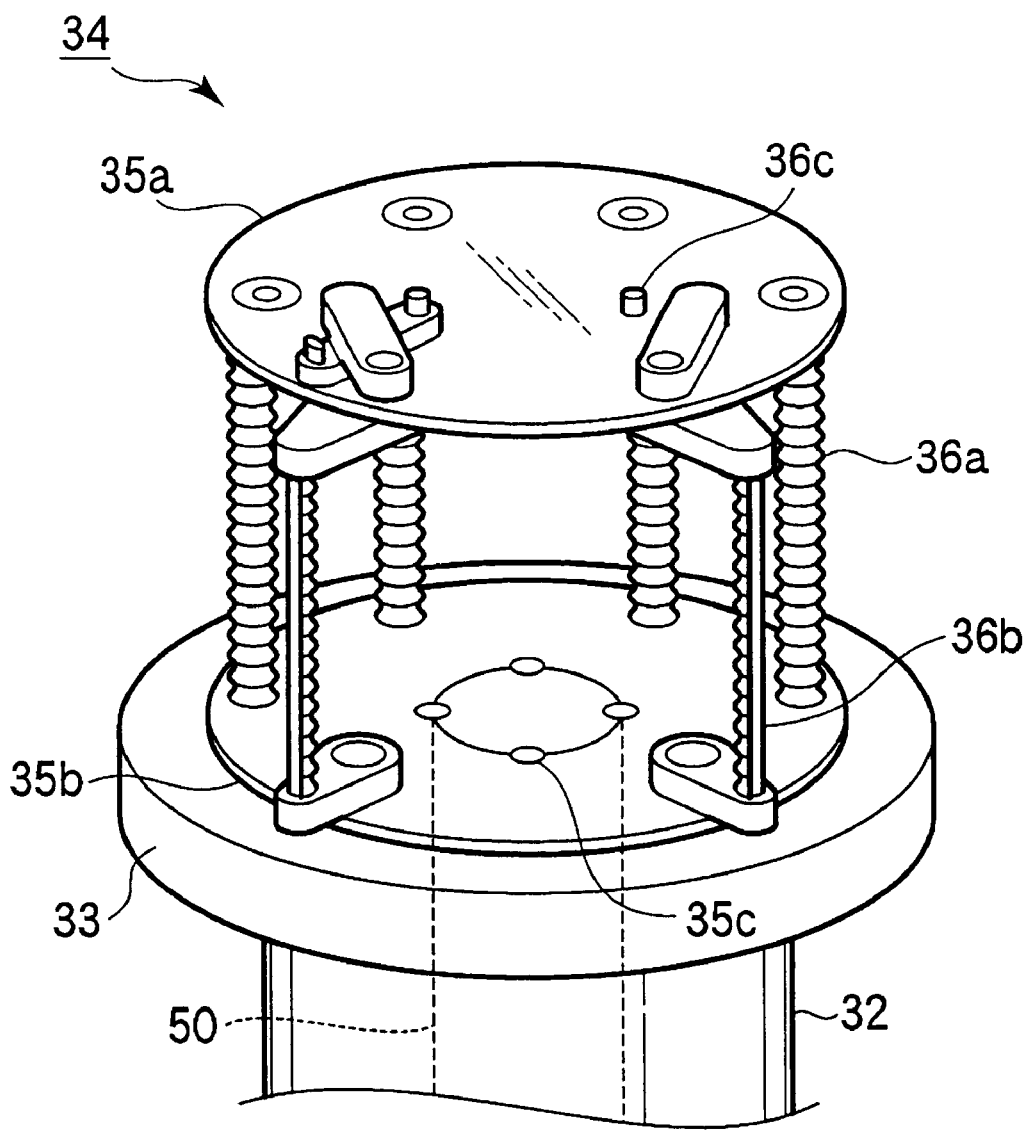
FIGS. 5A to 5E is for explaining the construction of a rotor.

FIG. 5 is an oblique view schematically showing the construction of the rotor 34. As shown in the drawing, the rotor 34 includes a pair of disks 35a, 35b arranged a predetermined distance apart from each other, an engaging member 36a provided with grooves or the like for holding the wafers W, an openable holder 36b also provided with grooves or the like, and a lock pin 36c controlling the opening/closing of the holder 36b.

A holder opening/closing mechanism 80 for opening/closing the holder 36b, which is mounted to the boundary wall 25 (see FIGS. 3 and 4), includes a lock pin pushing cylinder 81 and a holder opening/closing cylinder 82. Incidentally, since a cover 40 is arranged in that portion of the boundary wall 25 in which is arranged the holder opening/closing mechanism 80, the wafer transfer unit 4 and the cleaning processing unit 3 are isolated from each other.

The disk 35b of the rotor 34 is fixed to the rotary shaft 50 by using, for example, a screw 35c. Also, the engaging member 36a can be fixed between the disks 35a and 35b by, for example, screwing from the outside of the disks 35a and 35b. The lock pin 36c is projected outward in the ordinary state so as to inhibit the opening/closing operation of the holder 36b. On the other hand, when the holder opening/closing mechanism 80 gains access to the rotor 34 so as to permit the lock pin 36c to be pushed inward the rotor 34 by the pushing force generated from the lock pin pushing cylinder 81, the holder 36b is rendered openable by the holder opening/closing cylinder 82.

Under the state that the holder 36b is opened, it is possible to perform the delivery of the wafer W between the rotor 34 and the transfer picks 17a, 17b. On the other hand, under the state that the holder 36b is closed, the wafer W inside the rotor 34 is incapable of being moved out of the rotor 34.

The holder opening/closing mechanism 80 is swingable between the retreat position shown in FIG. 3 and the process position shown in FIG. 4 so as to permit the lock pin pushing cylinder 81 and the holder opening/closing cylinder 82 to gain access to the lock pin 36c and the holder 36b, respectively, in the position where the delivery of the wafer W is performed between the rotor 34 and the transfer picks 17a, 17b. In order to allow the holder 36b to perform its opening/closing operation, the lock pin pushing cylinder 81 includes a pushing mechanism for pushing the lock pin 36c inside the rotor 34 in the process position, and the holder opening/closing cylinder 82 is capable of gaining access to the holder 36b in the outside of the disk 35a so as to open/close the holder 36b.

Where the holder 36b is opened or closed in accordance with the operating modes of the holder 36b, the lock pin 36c and the holder opening/closing mechanism 80, the holder opening/closing mechanism 80 in, for example, its retreat position is moved to the process position so as to gain access to the rotor 34, thereby maintaining the state that the lock pin 36c is pushed by the lock pin pushing cylinder 81 into the rotor 34. Under this state, the holder opening/closing cylinder 82 is operated so as to open the holder 36b. As a result, it is made possible to transfer the wafer W into and out of the rotor 34.

After completion of the transfer operation of the wafer W, the holder 36b is closed and, then, the pushing force of the lock pin pushing cylinder 81 is released so as to bring the situation back to the original state that the lock pin 36c projects upward from the disk 35a so as to lock the holder 36b. Further, the holder opening/closing mechanism 80 is brought back to the retreat position.

The posture changing mechanism 28 for controlling the posture of the rotor rotating mechanism 27 includes a rotating mechanism 42 and a rotary shaft 41 attached to the rotating mechanism 42. The rotary shaft 41 is fixed to the joining section 32 of the rotor rotating mechanism 27. The rotating mechanism 42 makes it possible to hold the entire rotor rotating mechanism 27 in a posture (vertical posture) that permits horizontally holding the wafers W as shown in FIG. 3 or 4. It is also possible to change the posture of the rotor rotating mechanism 27 into a lateral posture so as to vertically hold the wafers W as shown in FIG. 6 referred to herein later.

The Z-axis linear driving mechanism 29 includes a motor 43, a mechanical power transmitting section 44 for transmitting the rotary driving force of the motor 43 to the posture changing mechanism 28, a guide 47, and a support member 48 for supporting the guide 47. The posture changing mechanism 28 is engaged with the guide 47 so as to be moved along the guide 47. Also, if the motor 43 is operated, the rotary driving force generated from the motor 43 is transmitted to the posture changing mechanism 28 via the mechanical power transmitting section 44, with the result that the posture changing mechanism 28 and the rotor rotating mechanism 27 are moved along the guide 47 in the Z-direction (vertical direction) by a predetermined distance.

In the embodiment described above, a mechanism for converting the rotational displacement of the motor 43 into a linear displacement is used as the Z-axis linear driving mechanism 29. However, the Z-axis linear driving mechanism 29 is not limited to the particular mechanism. For example, it is possible to use in place of the motor 43 a driving mechanism directly producing a linear displacement such as an air cylinder.

The X-axis linear driving mechanism 30 includes a guide 49, a motor (not shown), a ball screw 39a joined to the motor, an engaging member 39b in mesh with the ball screw 39a, and a joining member 38 engaged with the guide 49 so as to join the engaging member 39b to the support member 48.

If the motor is rotated, the ball screw 39a is operated. In accordance with operation of the ball screw 39a, the engaging member 39b is moved in the X-direction. In this case, since the joining member 38 joins the engaging member 39b to the support member 48, the joining member 38 and the support member 48 are also moved in the X-direction together with the engaging member 39b. In other words, when the engaging member 39b is moved in the X-direction, the rotor rotating mechanism 27, the posture changing mechanism 28 and the Z-axis linear driving mechanism 29 are moved simultaneously in the X-direction.

FIGS. 6A to 6E show as an example how the rotor rotating mechanism 27 is moved by using the posture changing mechanism 28, the Z-axis linear driving mechanism 29 and the X-axis linear driving mechanism 30, wherein FIG. 6A shows the locus of movement of the joining section 32 in the rotor rotating mechanism 27, and FIGS. 6B to 6E show the states (postures) of the rotor rotating mechanism 27 in the cases where the joining section 32 is in positions P1 to P4 shown in FIG. 6A. The following description covers the case where the rotor rotating mechanism 27 is moved such that the joining section 32 is moved from position P1 to position P4 in order to insert the rotor 34 holding wafers W into a chamber 70.

When the joining section 32 is in position P1, the rotor rotating mechanism 27 is in the position where it is possible to perform the delivery of the wafer W between rotor 34 and the wafer transfer mechanism 16. In this case, the rotor rotating mechanism 27 assumes a vertical posture. Then, under the state that the wafers W are housed in the rotor 34, the Z-axis linear driving mechanism 29 is operated first so as to move upward the rotor rotating mechanism 27 and the posture changing mechanism 28, thereby moving the joining section 32 to position P2. In position P2, the posture changing mechanism 28 is operated so as to swing the entire rotor rotating mechanism 27 by 90° such that the wafers W held horizontal by the rotor 34 come to be held vertical, and the entire rotor rotating mechanism 27 assumes a lateral posture.

In the next step, the Z-axis linear driving mechanism 29 is operated again so as to move upward the entire rotor rotating mechanism 27 while assuming a lateral posture such that the joining section 32 is moved upward to position P3. If the posture of the rotor rotating mechanism 27 is changed in position P2, which is an intermediate point in the upward movement of the rotor rotating mechanism 27, the space required for the rotation of the rotor rotating mechanism 27 can be diminished so as to diminish the volume occupied by the transfer section 3a, compared with the case where the rotor rotating mechanism 27 is rotated when the joining section 32 is in position P1 or position P3.

When the joining section 32 has arrived at position P3, the X-axis linear driving mechanism 30 is operated so as to move horizontally the position of the joining section 32 to point P4. When the joining section 32 is in position P4, the rotor 34 is inserted into the chamber 70 so as to apply a cleaning processing to the wafers W held in the rotor 34. In this fashion, the rotor 34 can be moved from the delivery position with the wafer transfer mechanism 16 to the cleaning processing position.

Incidentally, the state that the joining section 32 is in position P4 so as to insert the rotor 34 into the chamber 70 is shown in detail in FIGS. 7 and 8 referred to herein later. Needless to say, after completion of the cleaning processing applied to the wafers W, the joining section 32 is moved from position P4 to position P1 through the route opposite to the moving route of the rotor rotating mechanism 27 described above so as to be moved to the position where the wafers W held in the rotor 34 can be delivered to the wafer transfer mechanism 16.

The cleaning section 3b will now be described. As shown in FIG. 2, the chamber 70 of a double wall structure including a fixed outside chamber 71a and an inside chamber 71b slidable in the horizontal direction is arranged within the cleaning section 3b. FIGS. 7 and 8 are cross sectional views each showing the state that the rotor 34 is inserted into the chamber 70 arranged in the cleaning section 3b. FIG. 7 shows the state that the inside chamber 71b is in the retreat position outside the outside chamber 71a, and FIG. 8 shows the state that the inside chamber 71b is in the process position housed in the outside chamber 71a.

The outside chamber 71a includes a cylindrical body 61a, ring members 62a, 62b arranged in the edge surfaces of the cylindrical body 61a, seal mechanisms 63a, 63b formed in the inner circumferential surface of the ring members 62a, 62b, a cleaning liquid spurting nozzle 53 mounted to the cylindrical body 61a and having a large number of cleaning liquid spurting ports 54 formed in the horizontal direction, a nozzle case 57 housing the cleaning liquid spurting nozzle 53, and an exhaust/drain pipe 65a arranged in a lower portion of the outside chamber 71a so as to discharge the cleaning liquid and to discharge the gaseous material.

On the other hand, the inside chamber 71b includes a cylindrical body 61b, ring members 66a, 66b mounted to the edge surfaces of the cylindrical body 61b, seal mechanisms 67a, 67b formed in two positions in each of the inner circumferential surfaces of the ring members 66a, 66b, a cleaning liquid spurting nozzle 55 mounted to the cylindrical body 61 and having a large number of cleaning liquid spurting ports 56 formed in the horizontal direction, a nozzle case 58 housing the cleaning liquid spurting nozzle 55, and an exhaust/drain pipe 65b formed in a lower portion of the inside chamber 71b so as to discharge the cleaning liquid and to discharge the gaseous material to the outside.

Figure 7:
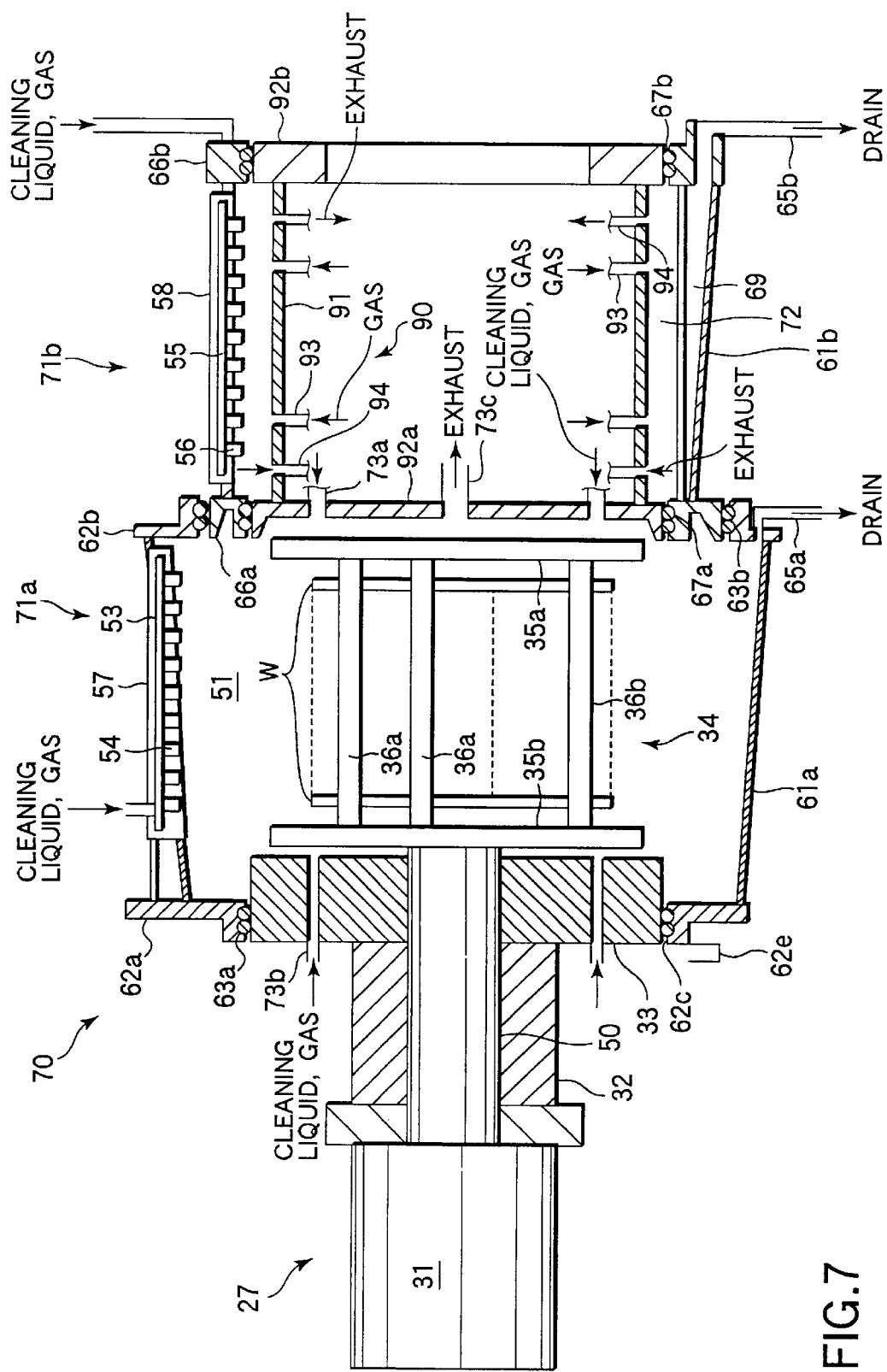
FIG. 7 is a cross sectional view showing one mode of the state that the rotor is inserted into the chamber.
Figure 8:
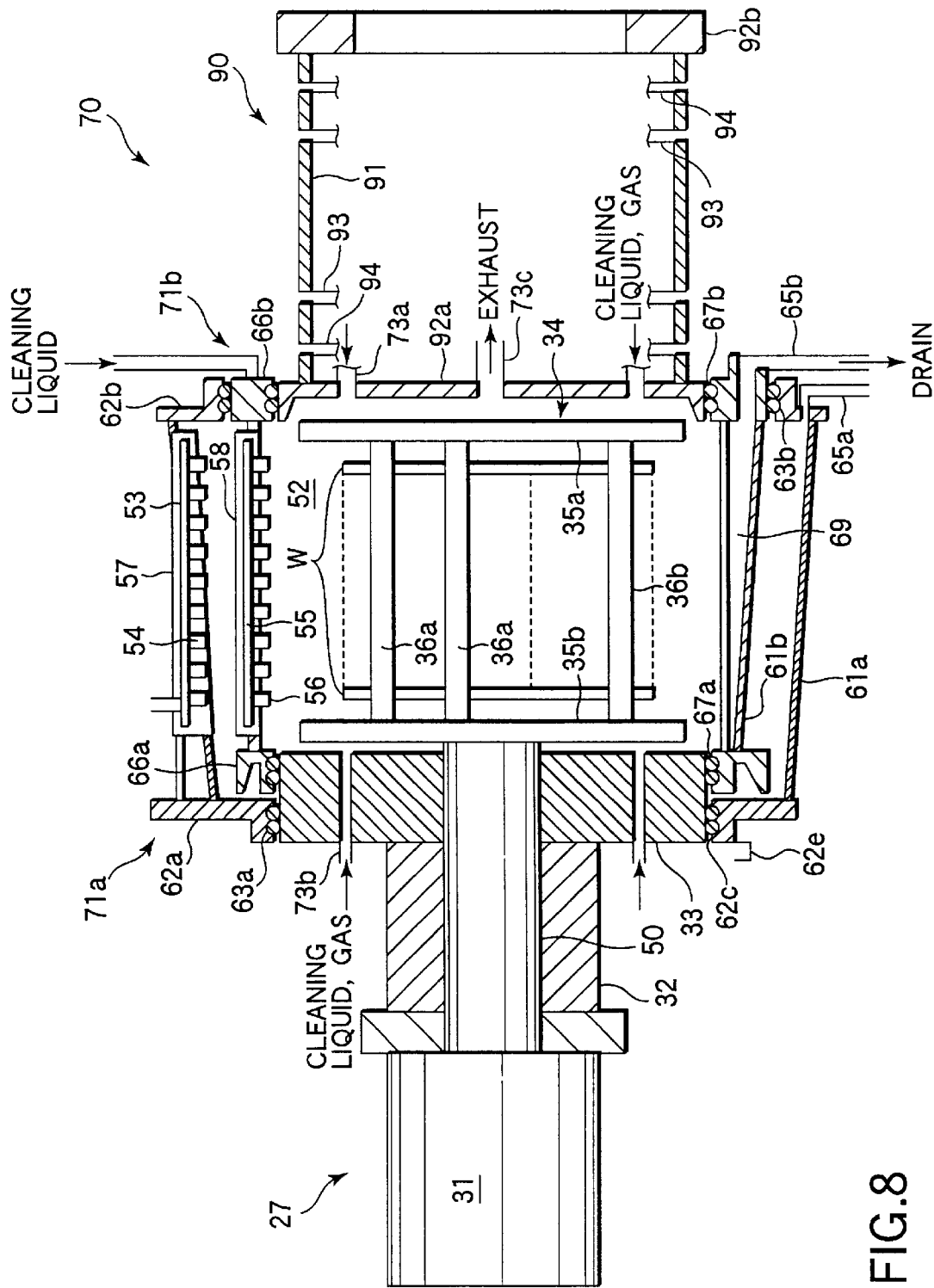
FIG. 8 is a cross sectional view showing another mode of the state that the rotor is inserted into the chamber.
Figure 15:
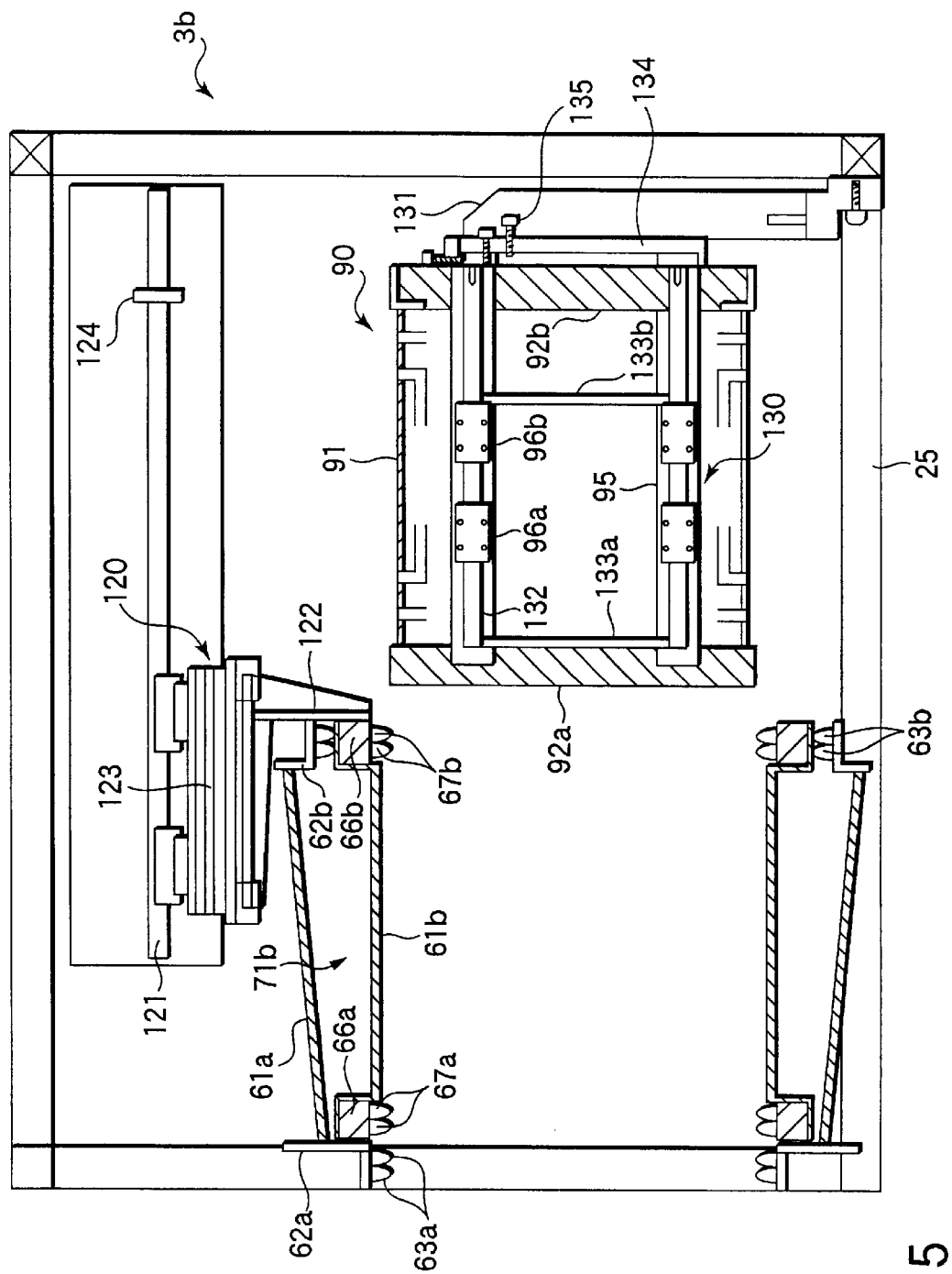
FIG. 15 is a cross sectional view showing one mode of the positional relationship between the chamber and the cleaning mechanism in the cleaning section.
Figure 16:
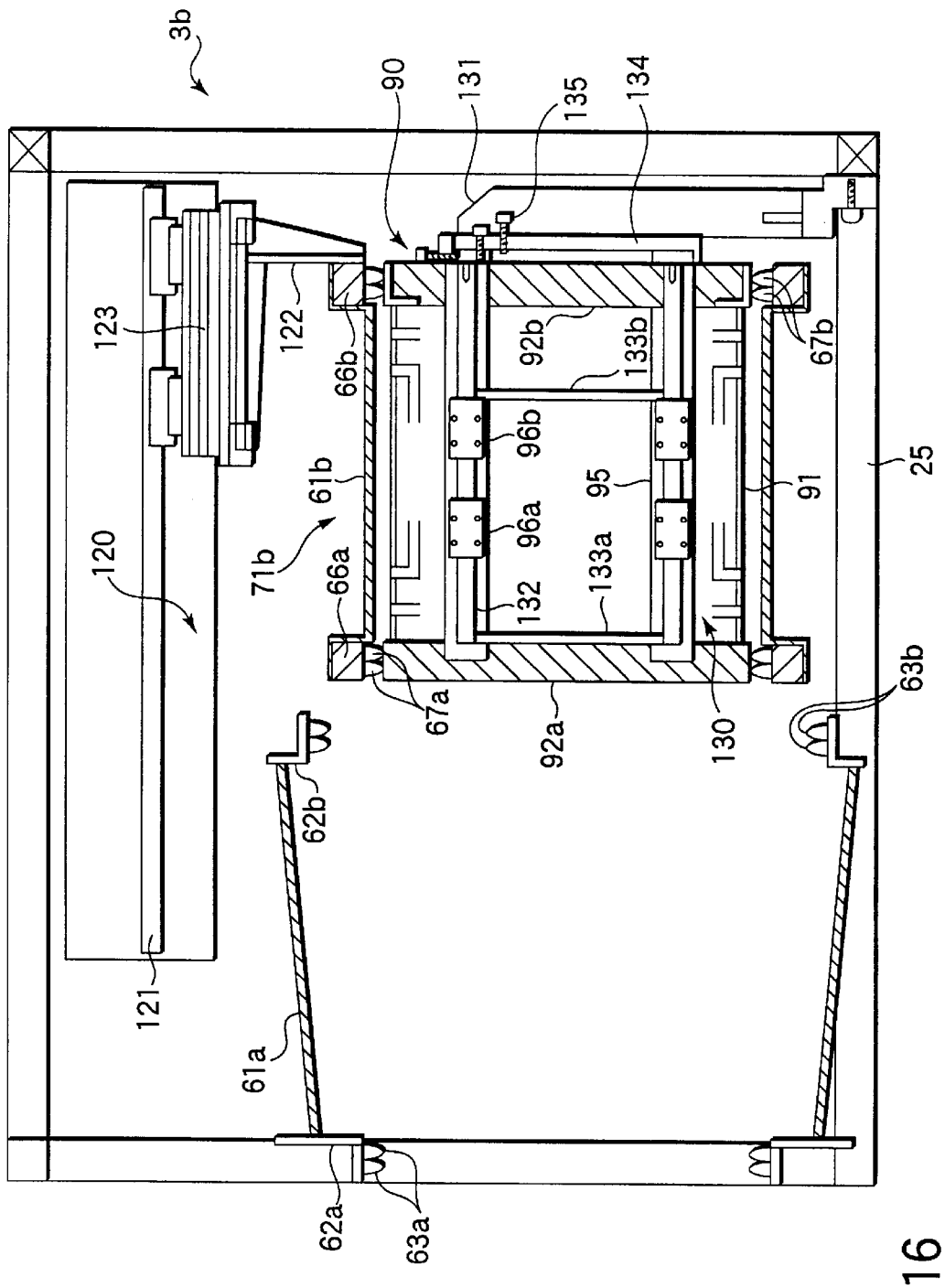
FIG. 16 is a cross sectional view showing another mode of the positional relationship between the chamber and the cleaning mechanism in the cleaning section.

As shown in FIGS. 7 and 8, a cleaning mechanism 90 for cleaning and drying the inside chamber 71b is mounted inside the cleaning section 3b. The cleaning mechanism 90 includes a cylindrical body 91, a disk 92a mounted to one edge surface of the cylindrical body 91, a ring member 92b mounted to the other edge surface of the cylindrical body 91, and a gas spurting nozzle 93 and an exhaust pipe 94 mounted to the cylindrical body 91. Further, a pure water spurting nozzle 73a and an exhaust pipe 73c are mounted to the disk 92a. Incidentally, as shown in FIGS. 15 and 16 referred to herein later, a sliding mechanism 120 for the inside chamber 71b and a sliding mechanism 130 for the cleaning mechanism 90 are arranged in the cleaning section 3b.

Figure 9:
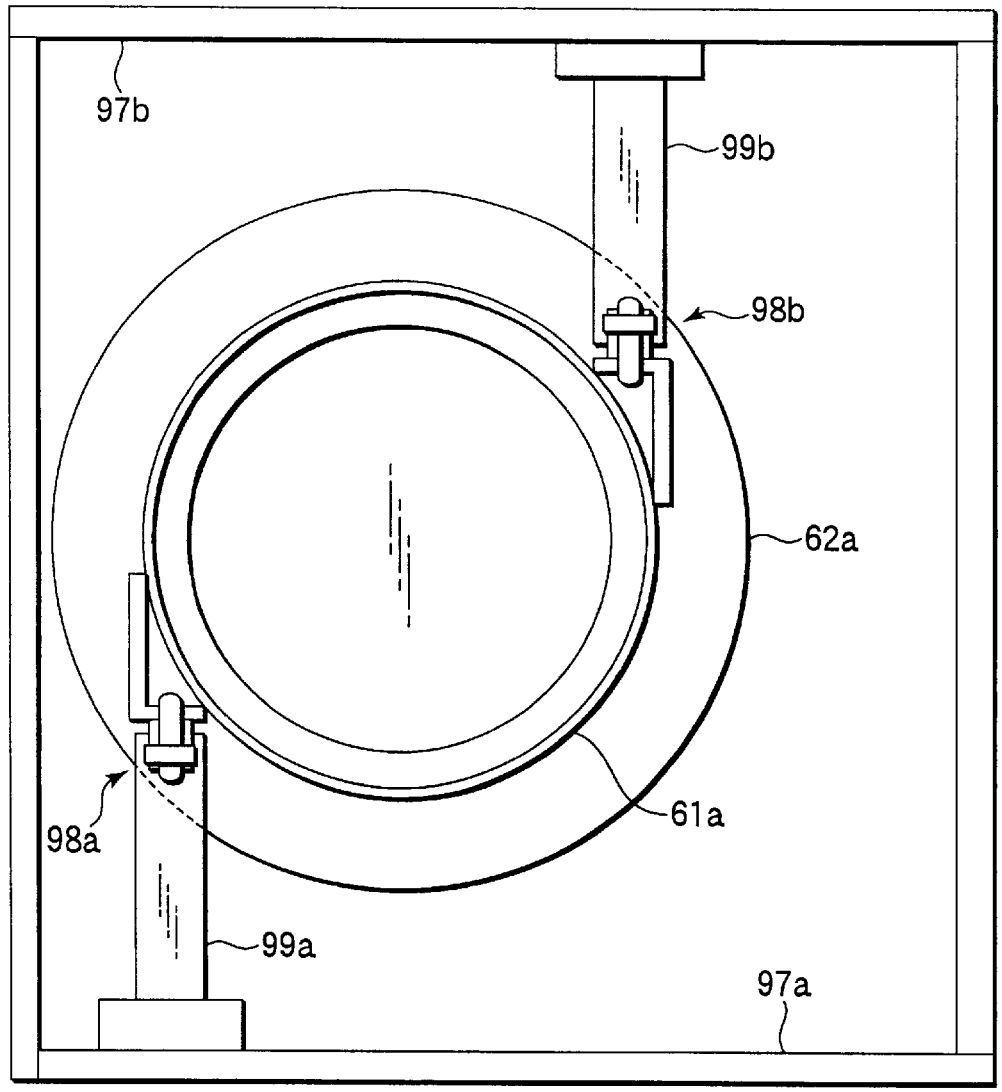
FIG. 9 is a front view showing the holding state of the outside chamber.

The outside chamber 71a will now be described more in detail. FIG. 9 is a front view as viewed from the side of the ring member 62b, though the ring member 62b is not shown in the drawing. The cylindrical body 61a and the ring members 62a, 62b, which collectively define the outer shape of the outside chamber 71a, are fixed to each other. The entire outside chamber 71a is held at a predetermined position by frames 99a, 99b supporting the cylindrical body 61a. The frames 99a, 99b are provided with position adjusting mechanisms 98a, 98b, respectively, for performing the fine adjustment of the height position and the horizontal position of the outside chamber 71a so as to make it possible to perform the insertion and the withdrawal of the rotor rotating mechanism 27 smoothly in a predetermined position. Incidentally, the frames 99a, 99b are fixed to a bottom plate 97a and a ceiling plate 97b, respectively, constituting the outer frame of the cleaning section 3b.

A rotor delivery port 62c for the insertion and withdrawal of the rotor 34 is formed in the ring member 62a. As shown in FIG. 2, the rotor delivery port 62c can be opened and closed by a lid 62d. Under the state that the rotor 34 is inserted into the outside chamber 71a, the rotor delivery port 62c is closed by a lid 33 mounted to the rotor rotating mechanism 27, and the clearance between the outer circumferential surface of the lid 33 and the rotor delivery port 62c is sealed by the seal mechanism 63a. As a result, the cleaning liquid is prevented from being scattered from within the chamber 70 into the transfer section 3a.

A liquid receptacle 62e is arranged in a lower portion outside the ring member 62a so as to prevent the cleaning liquid or the like attached to the lid 33, the seal mechanism 63a, etc. from leaking from the rotor delivery port 62c in transferring the rotor rotating mechanism 27. As a result, the floor of the cleaning section 3b is prevented from being stained with the cleaning liquid and, thus, the cleaning section 3b can be kept clean.

FIG. 10 exemplifies the seal mechanisms 63a, 63b. A rubber tube 85 is used suitably for forming the seal mechanism 63a, 63b. The rubber tube 85 is substantially in the shape of M in cross section in the non-sealing time, as shown in FIG. 10A. In the sealing time, however, a gaseous material such as the air having a predetermined pressure is supplied into the rubber tube 85 so as to allow the central concave portion to project upward as shown in FIG. 10B. The lid 33 or the like is brought into contact with the projecting central portion of the rubber tube 85 so as to produce the sealing function. The seal mechanisms 63a, 63b are formed in two portions of each of the ring members 62a, 62b, respectively, so as to ensure the sealing performance of the outside chamber 71a.

The rubber tube 85 is fitted into a groove 86 formed in the ring members 62a, 62b. Where the rubber tube 85 is rendered unusable because of the deterioration caused by a chemical liquid or the deterioration with time, it is possible to renew the rubber tube 85 alone. Incidentally, it is also possible to mount another ring member having the rubber tube 85 fitted therein to the ring member 62a, 62b so as to replace collectively the rubber tube 85 and the other ring member. How to replace the rubber tube 85 will be described herein later in detail.

In the case of using the seal mechanism 63a, 63b utilizing the gaseous pressure, it is possible to ensure a satisfactory sealing performance by increasing the gaseous pressure supplied to the rubber tube 85 even where the process pressure within the outside chamber 71a is high. The particular seal mechanism can also be employed for seal mechanisms 67a, 67b described herein later. It is also possible to employ a rubber sealing that does not utilize the air pressure. In this case, however, it is impossible to control the intensity of the sealing performance, making it necessary to pay attentions so as not to bring about leakage of the cleaning liquid.

A cleaning liquid such as a chemical liquid, a pure water or IPA or a drying gas such as a nitrogen gas ($N_2$) is supplied from a cleaning liquid supply source such as the chemical liquid storing unit 5 into the cleaning liquid spurting nozzle 53 mounted to the cylindrical body 61a so as to spurt the cleaning liquid from the cleaning liquid spurting ports 54 toward the wafers W held in the rotor 34. Only one spurting nozzle 53 is shown in each of FIGS. 7 and 8. However, it is possible to arrange a plurality of cleaning liquid spurting nozzles. Also, it is not absolutely necessary to arrange the cleaning liquid spurting nozzle 53 right above the cylindrical body 61a. This is also the case with the cleaning liquid spurting nozzle 55.

The cylindrical body 61a is shaped substantially conical such that the outer diameter on the side of the ring member 62b is larger than the outer diameter on the side of the ring member 62a. Also, the cylindrical body 61a is arranged in an inclined manner so as to permit that portion of the cylindrical body 61a on the side of the ring member 62b to be positioned lower than that portion of the cylindrical body 61a on the side of the ring member 62a. As a result, the various cleaning liquids spurted from the cleaning liquid spurting nozzle 53 toward the wafers W naturally flows on the bottom surface of the cylindrical body 61a from the side of the ring member 62a toward the side of the ring member 62b so as to be discharged to the outside through the exhaust/drain pipe 65a.

The gaseous material within the cylindrical body 61a is also discharged through the exhaust/drain pipe 65a. Therefore, the drying gas such as a nitrogen gas spurted from the cleaning liquid spurting nozzle 53 toward the wafers W is likely to flow from the cleaning liquid spurting nozzle 53 toward the exhaust/drain pipe 65a.

Figure 11:
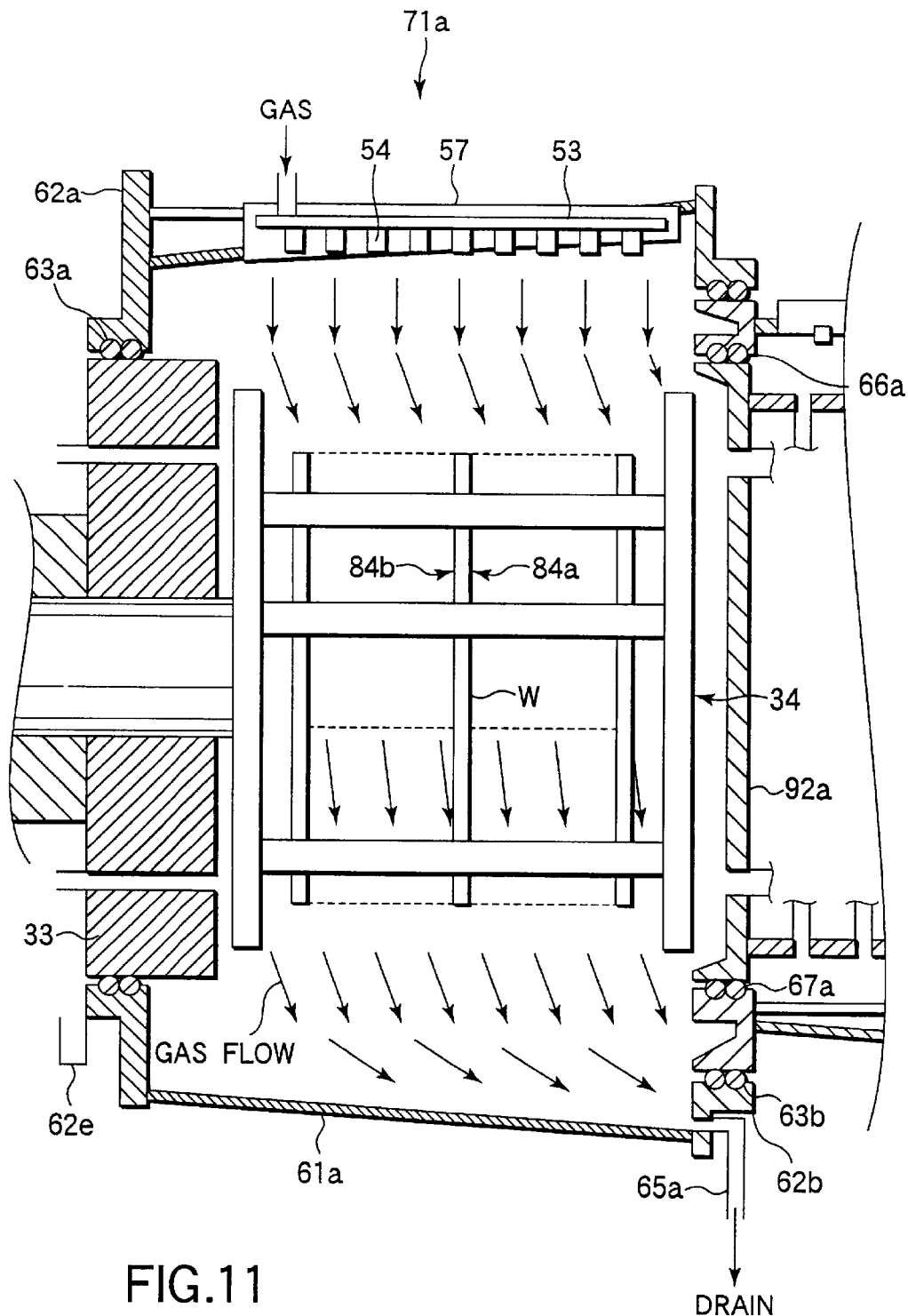
FIG. 11 is for explaining the state of the gas stream within an outside chamber.

FIG. 11 schematically shows the flow of the drying gas. If the wafer W is held in the rotor 34, when the rotor 34 is inserted into and held at a predetermined position within the outside chamber 71a, such that the main processing surface (mirror-like surface) 84a of the wafer W faces the ring member 62b, i.e., the downstream side of the drying gas, and the back surface 84b of the wafer W faces the ring member 62a, the gas stream is unlikely to collide against the main processing surface 84a of the wafer W. As a result, where, for example, the drying gas stream contains particles, the particles are not attached to the main processing surface 84a of the wafer W so as to suppress the attachment of the particles to the main processing surface 84a. It follows that it is possible to maintain a high quality of the wafer W so as to improve the reliability of the product.

Also, where the wafer W is held in the rotor 34 such that the main processing surface 84a of the wafer W faces the ring member 62b, and the back surface of the wafer W faces the ring member 62a, a difficulty is prevented even where the cleaning liquid flowing within the outside chamber 71a is scattered under the influence of the gaseous stream. To be more specific, the scattered cleaning liquid is affected by the flowing direction of the cleaning liquid so as to be unlikely to collide against the main processing surface 84a of the wafer W. As a result, it is possible to suppress the problem that a liquid droplet is attached to the main processing surface of the wafer W so as to cause the main processing surface 84a of the wafer W to bear the trace of the liquid droplet.

The inside chamber 71b and the cleaning mechanism 90 will now be described. The cylindrical body 61b forming the inside chamber 71b differs from the cylindrical body 61a of the outside chamber 71a. To be more specific, the cylindrical body 61b is in the form of a straight cylinder having a uniform outer diameter (the diameter on the side of the ring member 66a being equal to that on the side of the ring member 66b), and is arranged horizontal. Therefore, in order to facilitate the discharge of the cleaning liquid to the outside, formed is a groove section 69 projecting downward from the cylindrical body 61b and having a predetermined gradient. When the inside chamber 71b is in, for example, the process position, the cleaning liquid spurted from the cleaning liquid spurting nozzle 55 toward the wafer W flows through the groove section 69 so as to be discharged to the outside through the exhaust/drain pipe 65b.

A predetermined chemical liquid is supplied from the cleaning liquid supply source such as the chemical liquid storing unit 5 into the cleaning liquid spurting nozzle 55, with the result that the chemical liquid is spurted from the cleaning liquid spurting nozzles 56 toward the wafers W held in the rotor 34. Also, in order to clean the inside chamber 71b by using the cleaning mechanism 90, it is possible to spurt a pure water and a drying gas such as a nitrogen gas from the cleaning liquid spurting nozzle 55.

Where the inside chamber 71b is in the process position, the clearance between the ring member 66a and the lid 33 is sealed with the seal mechanism 67a, the clearance between the ring member 66b and the ring member 62b is sealed with the seal mechanism 63b, and the clearance between the ring member 66b and the disk 92a is sealed with the seal mechanism 67b, as shown in FIG. 8. As a result, a process space 52 is defined by the cylindrical body 61b, the ring members 66a, 66b, the disk 92a, and the lid 33 when the inside chamber 71b is in the process position.

On the other hand, when the inside chamber 71b is in the retreat position, the clearance between the ring member 66a and the ring member 62b is sealed with the seal mechanism 63b, and the clearance between the ring member 66a and the disk 92a is sealed with the seal mechanism 67a. Also, where the rotor 34 is inserted into the outside chamber 71a, the clearance between the lid 33 and the ring member 62a is sealed with the seal mechanism 63a. Therefore, when the inside chamber 71b is in the retreat position, a process space 51 is defined by the cylindrical body 61a, the ring members 62a, 62b, the disk 92a, the ring member 66a of the inside chamber 71b, and the lid 33 of the rotor rotating mechanism 27.

Under the state that the inside chamber 71b is in the retreat position, the process space 51 is formed in the process position as described above. Also, the clearance between the ring member 66a and the disk 92a is sealed with the seal mechanism 67a, and the clearance between the ring member 66b and the ring member 92b is sealed with the seal mechanism 67b, thereby forming a narrow substantially cylindrical cleaning processing space 72 between the outer circumferential surface of the cylindrical body 91 and the inner circumferential surface of the cylindrical body 61b. It is possible to spurt a drying gas such as a nitrogen gas or the air from the gas spurting nozzles 93 arranged at a plurality of portions of the cylindrical body 91 toward the cleaning processing space 72, with the result that the spurted drying gas is discharged to the outside through the exhaust pipe 94.

It follows that, if the inside chamber 71b is moved to the process position so as to perform the cleaning processing by supplying a predetermined chemical liquid to the wafer W within the process space 52, followed by moving the inside chamber 71b to the retreat position, it is possible to continue to carry out the cleaning processing by using, for example, a pure water within the process space 51 formed by the outside chamber 71a.

It should be noted that a dilute liquid is formed in the case of adding a pure water to the chemical liquid used for the cleaning processing using the inside chamber 71b. It is possible for the dilute solution thus formed to be, for example, strongly alkaline. However, the strongly alkaline dilute solution is formed in only a small amount even if a pure water is supplied to the wafer W and the rotor 34 to which is attached the chemical liquid because the chemical liquid is not attached to the outside chamber 71a. In addition, the residence time of the dilute solution within the process space 51 is short. It follows that the wafer W is unlikely to receive damage produced by the strongly alkaline dilute solution. It follows that it is possible to omit the IPA cleaning step employed in the past after the processing with the chemical liquid so as to improve the through-put of the cleaning processing and, thus, to reduce the processing cost.

Incidentally, a drying processing is performed after completion of the cleaning processing of the wafer W. After completion of the drying processing, the inner region of the outside chamber 71a is also put in the cleaned and dried state. It follows in the cleaning processing of the wafers W of the next batch, it is possible to carry out the cleaning processing using the outside chamber 71a immediately after the processing with a chemical liquid using the inside chamber 71b.

When the wafer W is cleaned with a pure water or dried with a drying gas, the pure water and the drying gas are unlikely to strike directly that surface of the disk 35a which faces the disk 92a and that surface of the disk 35b which faces the lid 33. It follows that it is possible to spurt a pure water and a drying gas from the pure water spurting nozzle 73a mounted to the disk 92a so as to clean and dry the disk 35a. It is also possible to spurt a pure water and a drying gas from the pure water spurting nozzle 73b mounted to the lid 33 so as to clean and dry the disk 35b.

Incidentally, it is also possible to spurt a predetermined gas such as an oxygen gas ($O_2$) or a carbon dioxide gas ($CO_2$) by using the pure water spurting nozzles 73a, 73b so as to form a predetermined gaseous atmosphere within the process spaces 51, 52. It is also possible to discharge the gas supplied to the process spaces 51, 52 to the outside not only through the exhaust/drain pipes 65a, 65b but also through the exhaust pipe 73c formed in the disk 92a.

The self-cleaning is applied to the inside chamber 71b slid to the retreat position after the processing with a chemical liquid by spurting a pure water from the cleaning liquid spurting nozzle 55 into the cleaning processing space 72. Since the cleaning processing space 72 is small and the spurted pure water is rebounded from the cylindrical body 91, it is possible to clean the inside chamber 71*b* effectively by using a small amount of a pure water. It is also possible to clean simultaneously the inner region of the cleaning liquid spurting nozzle 55 by spurting a pure water from the cleaning liquid spurting nozzle 55. Incidentally, it is also possible to mount a pure water spurting nozzle to the cylindrical body 91.

After the pure water spurted into the cleaning processing space 72 is discharged to the outside through the exhaust/drain pipe 65*b*, a drying gas such as a nitrogen gas or the air is spurted from the gas spurting nozzle 93 mounted to the cylindrical body 91 into the cleaning processing space 72. The gas thus spurted into the cleaning processing space is discharged to the outside through the exhaust pipe 94 and the exhaust/drain pipe 65*b*. In this case, it is possible to carry out the drying processing within the cleaning liquid spurting nozzle 55 by spurting a drying gas from the cleaning liquid spurting nozzle 55. In this fashion, the inner region of the inside chamber 71*b* is kept clean so as to make it possible to use the inside chamber 71*b* for the processing of the next wafer W with a chemical liquid.

Figure 12:
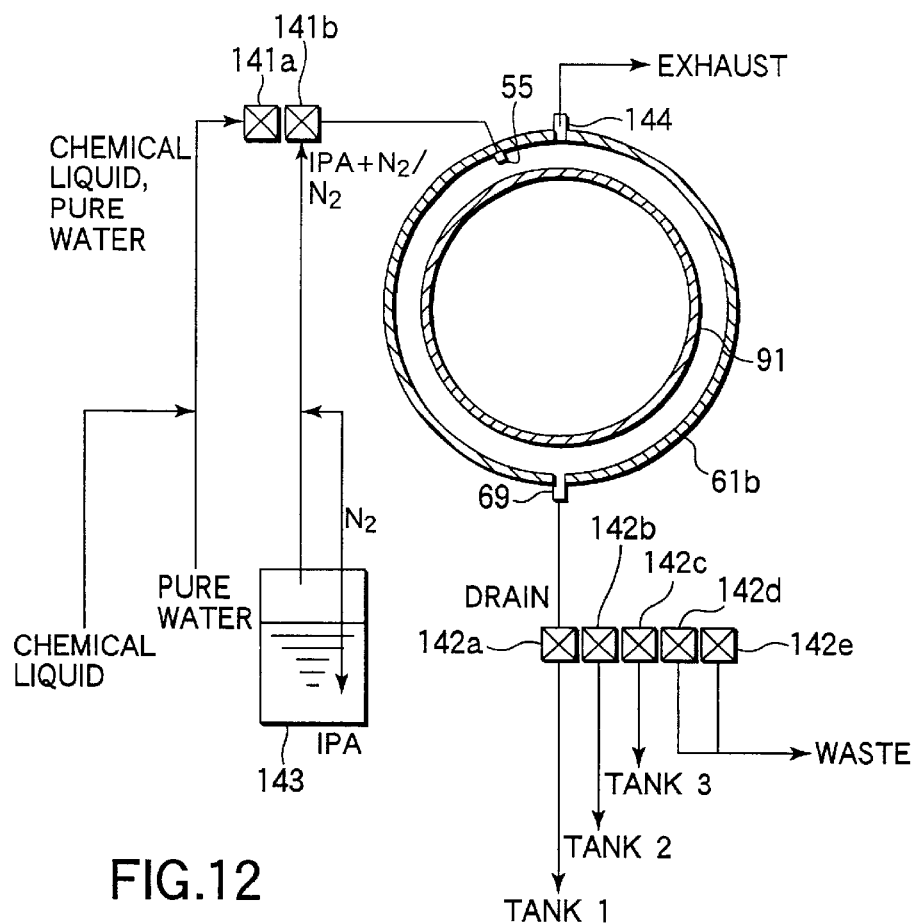
FIG. 12 is for explaining one mode of the construction of the cleaning mechanism.

In performing such a cleaning and drying of the inside chamber 71*b*, it is desirable to utilize particularly the Marangoni effect. FIG. 12 schematically shows the construction of the cleaning mechanism 90 for performing the cleaning processing of the inside chamber 71*b* by utilizing the Marangoni effect. In FIG. 12, the cylindrical body 61*b* of the inside chamber 71*b* and the cylindrical body 91 of the cleaning mechanism 90 are shown in a simplified fashion.

As shown in FIG. 12, where the inside chamber 71*b* is cleaned by utilizing the Marangoni effect, an exhaust port 144 is formed in an upper portion of the inside chamber 71*b*. Also, switching valves 141*a*, 141*b* are mounted to a pipe for supplying, for example, a chemical liquid to the cleaning liquid spurting nozzle 55. A chemical liquid, a pure water, a nitrogen gas containing IPA vapor, or a nitrogen gas is selectively supplied to the cleaning processing space 72 by operating the switching valves 141*a*, 141*b*. The nitrogen gas containing IPA vapor can be obtained by, for example, introducing a nitrogen gas into a tank 143 containing IPA for bubbling IPA.

The waste liquid discharged through the groove section 69 is separately recovered and discarded by operating switching valves 142*a* to 142*e*. For example, when the wafer W is being processed with, for example, a chemical liquid within the inside chamber 71*b*, the chemical liquid used for processing the wafer W is recovered in a tank 1 through the switching valve 142*a*. Also, a predetermined chemical liquid is recovered in a tank 2 through the switching valve 142*b*, and another chemical liquid is recovered in a tank 3 through the switching valve 142*c*. In this fashion, it is possible to recover every kind of the chemical liquid in the case where the wafer W is processed with a plurality of different kinds of chemical liquids.

The switching valve 142*d* is constructed to permit the flow of the cleaning liquid at a rate of, for example, 30 dm$^3$/min to 70 dm$^3$/min. Also, the switching valve 142*e* is constructed to permit the flow of the cleaning liquid at a rate of, for example, 5 dm$^3$/min to 25 dm$^3$/min. As described herein later, the switching valve 142*d* is used in the case where a large amount of a pure water is used for cleaning the inside chamber 71*b*, and the switching valve 142*e* is used in the case where the pure water stored in the cleaning processing space 72 is discharged at a predetermined flow rate.

Figure 13:
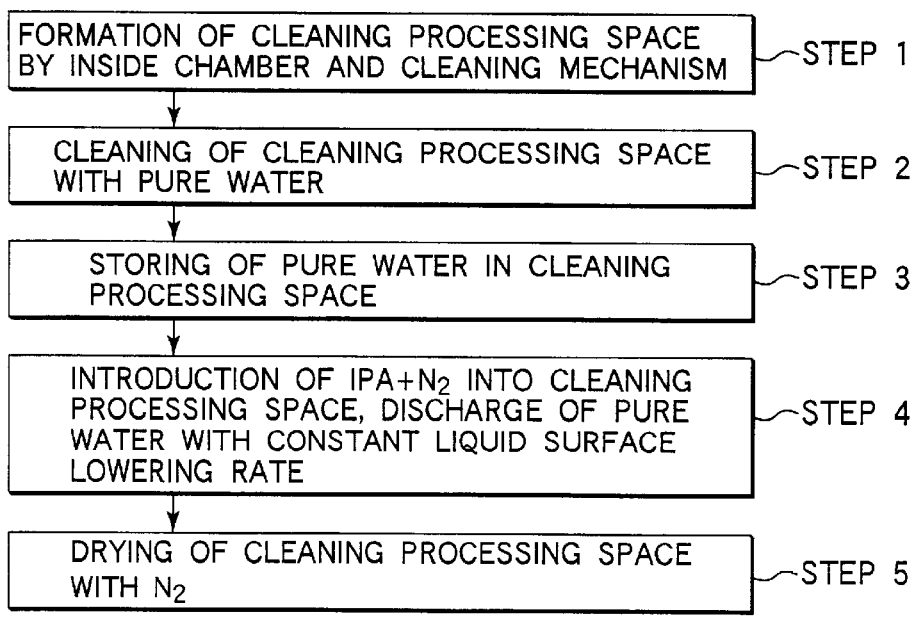
FIG. 13 is a flow chart showing one mode of the cleaning method of an inside chamber.

FIG. 13 is a flow chart showing the cleaning method of the inside chamber 71*b* by using the cleaning mechanism 90 of the particular construction, and FIGS. 14A to 14D schematically shows a mode of the cleaning processing performed in steps 2 to 5 shown in FIG. 13. First of all, the inside chamber 71*b* is slid to the retreat position, after the processing of the wafer W with a chemical liquid by using the inside chamber 71*b*, so as to form the cleaning processing space 72 (step 1). Then, a pure water is spurted from the cleaning liquid spurting nozzle 55 so as to wash away the chemical liquid attached to the wall surface forming the cleaning processing space 72 (step 2). The state of step 2 is shown in FIG. 14A. Also, the exhaust port 144 is kept closed in step 2, and the pure water containing the chemical liquid is discharged to the outside through the switching valve 142*d*.

When the pure water discharged through a drain pipe has substantially ceased to contain the chemical liquid, all the switching valves 142*a* to 142*e* are closed, and the exhaust port 144 is opened so as to store a pure water in the cleaning processing space 72 (step 3). The state of step 3 is shown in FIG. 14B. In this step, it suffices for the gas to be withdrawn through the exhaust port 144 in an amount corresponding to the volume of the pure water stored in the cleaning processing space 72. The amount of the pure water stored in the cleaning processing space 72 is controlled such that the cleaning liquid spurting nozzle 55 is not brought into contact with the pure water stored in the cleaning processing space 72.

Then, the cleaning processing space 72 is exhausted to set up a predetermined pressure within the cleaning processing space 72, and the pure water stored in the cleaning processing space 72 is discharged through the switching valve 142*e*, while spurting a nitrogen gas containing a predetermined amount of IPA from the cleaning liquid spurting nozzle 55 into the cleaning processing space 72 (step 4). The state of step 4 is shown in FIG. 14C.

In step 4, a large amount of IPA supplied into the cleaning processing space 72 is dissolved in the surface region of the pure water. Therefore, the opening degree of the switching valve 142*e* is controlled so as to permit the surface of the pure water within the cleaning processing space 72 to be lowered at a predetermined rate. As a result, when the pure water containing a large amount of IPA flows downward along the wall surface forming the cleaning processing space 72, the Marangoni effect is produced. According to the Marangoni effect, the pure water droplet does not remain on the wall surface forming the cleaning processing space 72 and, thus, the cleaning processing space 72 is dried uniformly.

After the pure water is discharged from within the cleaning processing space 72, the exhaust port 144 is closed so as to set up the state that the cleaning processing space 72 can be exhausted through the switching valve 142*d* and, then, a nitrogen gas alone is spurted from the cleaning liquid spurting nozzle 55 so as to dry the cleaning processing space 72 (step 5). The state of step 5 is shown in FIG. 14D. In step 5, it is desirable to use the gas spurting nozzle 93 mounted to the cylindrical body 91 (see FIGS. 7 and 8) as well as the cleaning liquid spurting nozzle 55 for spurting a nitrogen gas. Incidentally, how the nitrogen gas is spurted from the gas spurting nozzle 93 is shown in FIG. 14D, though the gas spurting nozzle 93 is not shown in the drawing. The drying processing with the nitrogen gas is performed such that the wall surface forming the cleaning processing space 72 maintains an appropriate humid state and is not dried completely. In this case, it is possible to prevent the particle generation.

The cleaning processing of the inside chamber 71*b* can be performed for every batch processing of the wafers W. It is also possible to perform the cleaning processing of the inside chamber 71b after completion of the processing of the wafers W for a plurality of batches, e.g., 5 batches. Further, it is possible to perform the cleaning processing of the inside chamber 71b every predetermined time period. In this case, the state of progress in the processing of the wafer W is confirmed so as not to obstruct the processing of the wafer W.

Further, where the cleaning processing apparatus 1 is left unused for a time longer than a predetermined time, e.g., where the operation of the cleaning processing apparatus 1 is stopped for a long time for the purpose of, for example, the maintenance operation, it is considered reasonable to understand that particles are generated because the inside chamber 71b is dried completely. Such being the situation, it is desirable to apply a cleaning processing to the inside chamber 71b before the re-start up of the cleaning processing apparatus 1 for the processing of the first batch. As a result, the particles, etc. present inside the inside chamber 71b can be removed so as to process the wafer W under a clean environment.

The sliding mechanism 120 of the inside chamber 71b and the sliding mechanism 130 of the cleaning mechanism 90, which are arranged in the cleaning section 3b, will now be described. FIG. 15 is a cross sectional view showing the state that the inside chamber 71b is moved to the process position, and that the cleaning mechanism 90 is moved to the maintenance position. Also, FIG. 16 is a cross sectional view showing the state that each of the inside chamber 71b and the cleaning mechanism 90 is moved to the maintenance position.

Incidentally, the state that the cleaning mechanism 90 is in the retreat position of the inside chamber 71b is shown in FIGS. 7 and 8. Also, the position of the cleaning mechanism 90 can be clearly grasped on the basis of the position of the outside chamber 71a. Such being the situation, a plan view showing the state that the cleaning mechanism 90 is in the retreat position of the inside chamber 71b is not presented. Also, as shown in FIGS. 7 and 8, the cleaning mechanism 90 is in the retreat position of the inside chamber 71b so as to form the cleaning processing space 72 under the state of performing the cleaning processing of the wafer W. Therefore, it may be reasonable to understand that the retreat position of the inside chamber 71b provides the "process position" of the cleaning mechanism 90. In the present specification, however, it is defined for the sake of convenience that the cleaning mechanism 90 is in the retreat position when the cleaning mechanism 90 is in the retreat position of the inside chamber 71b.

Arranged inside the cylindrical body 91, which is a constituent member of the cleaning mechanism 90, are a frame 95 stretched between the disk 92a and the ring member 92b and through-hole forming members 96a (on the side of the disk 92a) and 96b (on the side of the ring member 92b) capable of forming spaces through which extends a guide 132. Also, the sliding mechanism 130 of the cleaning mechanism 90 includes a support rod 131 fixed to the boundary wall 25, two guides 132, stoppers 133a, 133b stretched between the two guides 132, and a joining member 134 for joining the guide 132 to the support rod 131. Since the support rod 131 and the joining member 134 are fixed to each other by using, for example, a screw 135, the cleaning mechanism 90, the guide 132 and the joining member 134 can be integrally mounted to and detached from the support rod 131.

The two guides 132 are fixed, and the cleaning mechanism 90 is arranged such that each of the two guides 132 extends through the void formed by the frame 95 and the through-hole forming members 96a, 96b. Because of the particular construction, the cleaning mechanism 90 is slidable between the retreat position and the maintenance position.

When the cleaning mechanism 90 is moved to the retreat position, the through-hole forming member 96a abuts against the stopper 133a so as to determine the position of the cylindrical body 91. Also, the cylindrical body 91 is held immovable by the stopper (not shown).

Where the cleaning mechanism 90 is moved to the maintenance position, the through-hole forming member 96b abuts against the stopper 133b so as to determine the position of the cylindrical body 91. Incidentally, it is also possible to allow the ring member 92b to abut against the joining member 134 so as to determine the position of the cleaning mechanism 90 within the maintenance position.

The sliding mechanism 120 of the inside chamber 71b includes a guide 121, a moving member 123 movable along the guide 121, a joining member 122 for joining the moving member 123 to the ring member 66b of the inside chamber 71b, and a stopper 124 for limiting the sliding range of the moving member 123. The joining member 122 is detachable from the ring member 66b. During the cleaning processing, the stopper 124 limits the sliding range of the inside chamber 71b such that the inside chamber 71b can be slid between the process position and the retreat position. However, if the stopper 124 is removed in the maintenance time, it is possible to slide the inside chamber 71b to the maintenance position.

It is possible to replace easily the rubber tube 85 used in each of the seal mechanisms 63a, 63b, 67a, and 67b without detaching the outside chamber 71a and the inside chamber 71b by controlling appropriately the positions of the inside chamber 71b and the cleaning mechanism 90 by using the sliding mechanism 120 and the sliding mechanism 130.

To be more specific, it is possible to gain access to the seal mechanism 63a through the rotor delivery port 62c from the side of the transfer section 3a regardless of the positions of the inside chamber 71b and the cleaning mechanism 90. Also, as shown in FIG. 8 or 15, where the inside chamber 71b is in the process position, it is possible to gain access to the seal mechanism 67a through the rotor delivery port 62c from the side of the transfer section 3a. As a result, it is possible to replace easily the rubber tube 85 in each of, for example, the seal mechanism 63a and the seal mechanism 67a.

Also, it is possible to gain access to the seal mechanism 67b of the inside chamber 71b so as to replace the rubber tube 85 of the seal mechanism 67b by holding the inside chamber 71b in the process position and by moving the cleaning mechanism 90 to the maintenance position, as shown in FIG. 15. Further, it is possible to gain access to the seal mechanism 63b of the outside chamber 71a so as to replace easily the rubber tube 85 of the seal mechanism 63b by holding the inside chamber 71b in the maintenance position and by moving the cleaning mechanism 90 to the maintenance position, as shown in FIG. 16.

Incidentally, it is possible to detach easily the inside chamber 71b by moving the inside chamber 71b to the maintenance position after the cleaning mechanism 90 is detached under the state that the inside chamber 71b is moved to the process position. It follows that the cleaning section 3b can be easily cleaned in detail in, for example, the periodic maintenance operation.

The cleaning processing process will now be described, covering the case where the wafers W housed in two FOUPs F1, i.e., the FOUP F disposed on the FOUP stage 2a, and F2, i.e., the FOUP F disposed on the FOUP stage 2b, are subjected to the cleaning processing. In the first step, the FOUPs F1 and F2 each housing 25 wafers W in parallel a predetermined distance apart from each other are disposed on the FOUP stages 2a and 2b, respectively, such that the wafer delivery ports of the FOUPs F1, F2, through which the wafers W are put into and taken out of the FOUPs F1, F2, are allowed to face the window sections 12a and 12b, respectively.

In order to take the wafer W out of the FOUP F1, the window section 12a is opened so as to permit the inner space of the FOUP F1 to communicate with the inner space of the wafer transfer unit 4. Then, the number of wafers W housed in the FOUP F1 is counted and the housed state of the wafers W is inspected by using the wafer inspecting mechanism 110. Where an abnormality has been detected in the housed state of the wafers W, the processing of the wafers W housed in the FOUP F1 is stopped, and the wafers W housed in, for example, the FOUP F2 are taken out.

Where an abnormality has not been detected in the housed state of the wafers W within the FOUP F1, the wafer transfer mechanism 16 is operated so as to transplant all the wafers W housed in the FOUP F1 onto the transfer pick 17a, followed by operating the linear driving mechanism 19 and the rotary mechanism 22 so as to allow the transfer pick 17a to be capable of gaining access to the rotor 34. Further, the height position of the transfer pick 17a is adjusted by operating the lift mechanism 23, followed by opening the window section 25a and opening the holder 36b by using the holder opening/closing mechanism 80 so as to insert the transfer pick 17a holding the wafers W into the rotor 34. After the holder 36b has been closed, the transfer pick 17a is brought back to the original position so as to transplant the wafers W into the rotor 34.

After the holder opening/closing mechanism 80 has been retreated, the rotor 34 is inserted into the outside chamber 71a. Also, the rotor rotating mechanism 27 is moved by operating the posture changing mechanism 28, the Z-axis linear driving mechanism 29 and the X-axis linear driving mechanism 30 so as to permit the lid 33 to be positioned in the rotor delivery port 62c. Then, the seal mechanism 63a is operated so as to seal the clearance between the ring member 62a and the lid 33, and the inside chamber 71b is moved to the process position so as to form the process space 52. Further, the rotor 34 is rotated by driving the motor 31. Under this condition, a predetermined chemical liquid is supplied from the cleaning liquid spurting nozzle 55 onto the wafers W so as to carry out the processing with the chemical liquid.

After completion of the processing with the chemical liquid, the inside chamber 71b is moved to the retreat position so as to subject the inside chamber 71a to a cleaning and drying processing with the cleaning mechanism 90, thereby making the inside chamber 71b ready for the processing of the wafers W of the next batch. On the other hand, while rotating the wafers W, a pure water is spurted from the cleaning liquid spurting nozzle 53 onto the wafers W within the process space 51 formed by the outside chamber 71a so as to clean the wafers W with the pure water, followed by applying a drying processing to the wafers W with a nitrogen gas.

While the wafers W are being processed in the cleaning processing unit 3 as described above, the wafer transfer mechanism 16 under the state that the wafers W are not held thereon is moved to permit the transfer pick 17a to gain access to the FOUP F2 disposed on the FOUP stage 2b in the wafer transfer unit 4 so as to transplant the wafers W housed in the FOUP F2 onto the transfer pick 17a by using the method similar to that for transferring the wafers W out of the FOUP F1. Then, the wafer transfer mechanism 16 is moved to permit the transfer pick 17b not holding the wafers W to gain access to the rotor 34 through the window section 25a. In this stage, unprocessed wafers W are held by the transfer pick 17a.

After completion of the cleaning processing of the wafers W within the cleaning processing unit 3, the rotor rotating mechanism 27 holding the wafers W is moved by driving the X-axis linear driving mechanism 30, etc. so as to move the wafers W to the position where the wafers W can be delivered between the transfer picks 17a, 17b and the rotor 34. Then, the window section 25a is opened so as to allow first the transfer pick 17b to gain access to the rotor 34 so as to transplant the wafers W held by the rotor 34 onto the transfer pick 17b. Then, the rotary mechanism 22 is operated so as to swing the table 21 by 180°, thereby permitting the transfer pick 17a to gain access to the rotor 34 and transplanting the unprocessed wafers W held by the transfer pick 17a into the rotor 34.

A cleaning processing is applied to the wafers W housed in the FOUP F2 held by the rotor 34 by the process similar to the cleaning process described previously of the wafers W housed in the FOUP F1. While the cleaning processing is being applied to the wafers W housed in the FOUP F2, the wafer transfer mechanism 16 is operated to permit the transfer pick 17b to gain access to the FOUP F1 so as to transplant the wafers W after the cleaning processing into the FOUP F1. Then, the wafer transfer mechanism 16 is put in the state that the transfer pick 17b is capable of gaining access to the rotor 34. The wafers W after the cleaning processing are housed in the FOUP F2 by the procedure similar to the above-described procedure of housing the wafers W after the cleaning processing in the FOUP F1, thereby finishing the cleaning processing of the wafers W housed in the FOUPs F1 and F2.

Incidentally, where, for example, the FOUP F3 having the wafers W housed therein is further disposed on the FOUP stage 2c, it is possible to perform continuously the cleaning processing of the wafers W housed in the FOUP F3 by transplanting the wafers housed in the FOUP F3 onto the transfer pick 17a after completion of the processing of the wafers W housed in the FOUP F1 and by transplanting the wafers W held by the transfer picks 17a into the rotor 34 after the cleaned wafers W housed in the FOUP F2 have been transferred out of the rotor 34.

The present invention is not limited to the embodiment described above. For example, in the embodiment described above, the gas spurting nozzle 93 is mounted to the cylindrical body 91 constituting the cleaning mechanism 90. Alternatively, it is also possible to mount a pure water spurting nozzle for spurting a pure water into the cleaning processing space 72 to the cylindrical body 91. Also, it is desirable for the gas spurting nozzle 93 to be constructed such that a pure water can also be spurted from the gas spurting nozzle 93. It is also desirable to mount a heater to the cylindrical body 61b constituting the inside chamber 71b for promoting the drying of the inside chamber 71b.

Figure 17A:
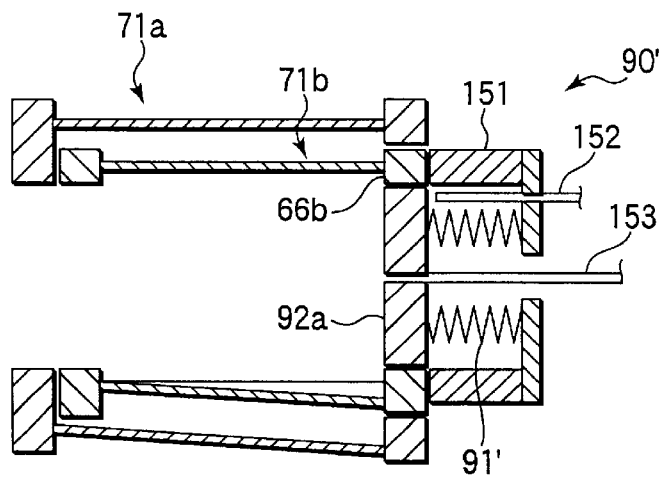
FIGS. 17A and 17B is for explaining another mode of the construction of the cleaning mechanism.
Figure 17B:
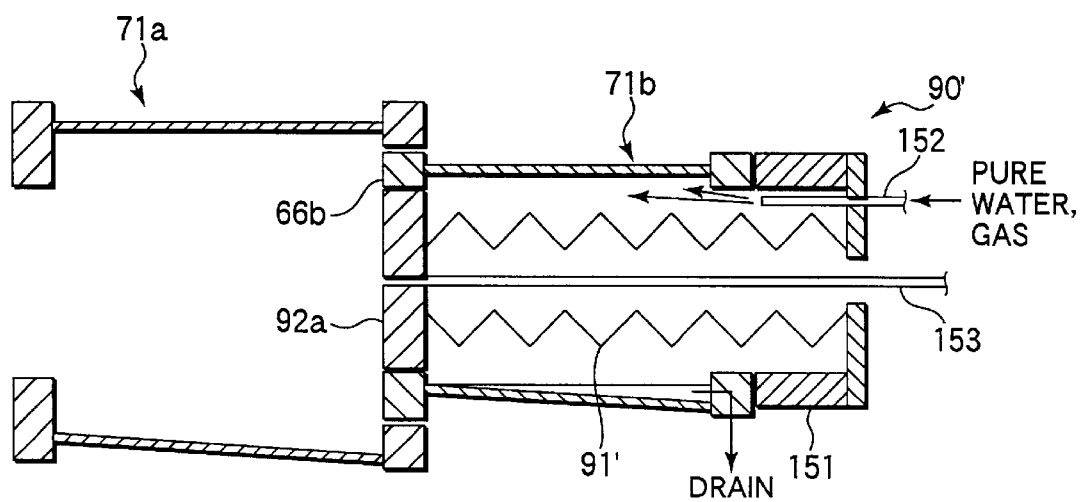

It is also possible to change the construction of the cleaning mechanism 90. FIGS. 17A and 17B is for explaining the schematic construction and the mode of operation of a cleaning mechanism 90', which is another embodiment of the cleaning mechanism 90. As shown in the drawing, the cleaning mechanism 90' includes a shrinkable cylindrical body (bellows) 91' and a bellows holding member 151 for holding the bellows 91'. The bellows holding member 151 is fixed to the ring member 66b of the inside chamber 71b. A pure water spurting nozzle 152 capable of spurting a pure water and a nitrogen gas is mounted to the bellows holding member 151, and a pure water spurting nozzle 153 capable of spurting a pure water and a gas is also mounted to the disk 92a. It is possible to allow the pipe that holds the pure water spurting nozzle 153 to play the role of holding the disk 92a.

When the inside chamber 71b is in the process position, the bellows 91' is a shrunk state, as shown in FIG. 17A. On the other hand, when the inside chamber 71b is in the retreat position, the bellows 91' is elongated so as to form a cleaning processing space 72', as shown in FIG. 17B. It is possible to apply a cleaning processing to the inside chamber 71b by spurting a pure water or a gas from the pure water spurting nozzle 152 into the cleaning processing space 72'. Incidentally, where the cleaning processing of the inside chamber 71b is performed by utilizing the Marangoni effect described previously, it suffices to mount an exhaust port for exhausting the cleaning processing space 72' in an upper portion of the bellows holding member 151.

In the cleaning mechanism 90' of the construction described above, the clearance between the bellows 91' and the bellows holding member 151 is hermetically closed when the inside chamber 71b is in the process position. It follows that, even where cleaning liquids such as a chemical liquid or a pure water are attached to the bellows 91' after the cleaning processing of the inside chamber 71b, it is possible to prevent these cleaning liquids from being evaporated so as to be released to the outside. It is also possible to prevent the cleaning liquid from leaking through the bellows 91'.

In the embodiment described above, the technical idea of the present invention is applied to a cleaning processing apparatus. However, it is also possible to apply the technical idea of the present invention to any type of a liquid processing apparatus in which it is necessary to clean the chamber when the process liquid used is changed, because it is undesirable for the process liquid used in the preceding stage to be mixed in the process liquid used for the liquid processing. For example, the liquid processing apparatus of the present invention can be used for the coating processing for coating a predetermined coating liquid or for the etching processing.

In the embodiment described above, the chamber 70 is of a double wall structure. However, it is possible for the chamber 70 to be of a single wall structure or of a triple wall structure. In the case of using a chamber of a single wall structure, it is impossible in many cases to apply a liquid processing to the substrate when the chamber is being cleaned after the processing with a chemical liquid so as to make it difficult to obtain the effect of improving the through-put. It should be noted in this connection that, in order to prevent the chemical liquid used in the former stage from being mixed with the chemical liquid used in the latter stage, it was customary in the past to use a process liquid in the intermediate stage between the former stage and the latter stage so as to wash away the chemical liquid used in the former stage. In the case of using a chamber of the single wall structure, however, it is unnecessary to use the process liquid noted above so as to obtain the effect of reducing the processing cost. Further, in the embodiment described above, a semiconductor wafer was exemplified as a substrate to be processed. However, the present invention can also be applied to the processing of other substrates such as a substrate for a liquid crystal display device (LCD).

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A liquid processing apparatus for performing a liquid processing by supplying a process liquid to a plurality of substrates, comprising:
   a rotor capable of holding said plural substrates a predetermined distance apart from each other;
   a chamber capable of housing said rotor and arranged slidable between a process position and a retreat position;
   a process liquid spurting nozzle for spurting said process liquid onto the substrates housed in said chamber; and
   a cleaning mechanism for cleaning said chamber;
   wherein said cleaning mechanism includes a process space-forming member positioned inside said chamber in its retreat position and forming a cleaning process space in the clearance between said chamber and said process space-forming member, a cleaning liquid spurting nozzle for spurting the cleaning liquid into said cleaning processing space, and a gas spurting nozzle for spurting a drying gas into said cleaning processing space.

2. The liquid processing apparatus according to claim 1, wherein:
   said chamber is of a double wall structure including a substantially cylindrical fixed outside chamber and a substantially cylindrical inside chamber that can be housed in said outside chamber and is arranged slidable between a process position and a retreat position;
   said process liquid spurting nozzles spurts a process liquid into said inside chamber;
   said cleaning mechanism cleans said inside chamber in its retreat position; and
   said process space-forming member is a cylindrical body forming a substantially cylindrical cleaning processing space between the inner wall of said inside chamber and said process space-forming member in the retreat position of said inside chamber.

3. The liquid processing apparatus according to claim 2, wherein said rotor is capable of being moved into and out of said outside chamber through one edge surface of said outside chamber, and said inside chamber is capable of being moved into and out of said outside chamber through the other edge surface of said outside chamber.

4. The liquid processing apparatus according to claim 2, wherein said gas spurting nozzle is mounted to at least said cylindrical body.

5. The liquid processing apparatus according to claim 2, wherein said cleaning liquid spurting nozzle uses a process liquid spurting nozzle for spurting a process liquid to the substrate held in said rotor.

6. The liquid processing apparatus according to claim 2, wherein an exhaust port for exhausting the gas spurted from said gas spurting nozzle is mounted to said cylindrical body.

7. The liquid processing apparatus according to claim 1, further comprising rotating means joined to said rotor for allowing the substrate held by said rotor to make a planar rotation, and a moving mechanism for moving said rotor and said rotating means between the process position and the substrate delivery position where the delivery of the substrate is performed in said rotor.

8. The liquid processing apparatus according to claim 1, wherein said process liquid spurting nozzle is also capable of spurting a cleaning liquid for cleaning said chamber.

9. A liquid processing method for performing a liquid processing by supplying a process liquid to the substrates held by a rotor capable of holding a plurality of substrates a predetermined distance apart from each other by using a liquid processing apparatus including:

a fixed substantially cylindrical outside chamber;

a substantially cylindrical inside chamber capable of being housed inside said outside chamber and slidable between a process position and a retreat position; and a cleaning mechanism for cleaning said inside chamber in its retreat position;

said method comprising:

a first step for applying a liquid processing to said substrates by using said inside chamber in its process position;

a second step of applying a liquid processing to said substrates by using said outside chamber with said inside chamber by moving said inside chamber to its retreat position; and a third step of cleaning said inside chamber by said cleaning mechanism at a predetermined timing in its retreat position.

10. The liquid processing method according to claim 9, wherein said third step comprises:

a first sub-step of arranging a cylindrical body within said inside chamber thereby forming a cleaning processing space;

a second sub-step of supplying a pure water into said cleaning processing space thereby cleaning said inside chamber; and a third sub-step of drying said cleaning processing space by utilizing a Marangoni effect.

11. The liquid processing method according to claim 9, wherein said third step comprises:

a first sub-step of arranging a cylindrical body within said inside chamber thereby forming a cleaning processing space;

a second sub-step of discarding a predetermined amount of the used pure water from said cleaning processing space while supplying a pure water into said cleaning processing space;

a third sub-step of storing a pure water in said cleaning processing space; and a fourth sub-step of discharging the pure water stored in said cleaning processing space at a predetermined flow rate while supplying an inert gas and a water-soluble solvent into said cleaning processing space thereby drying the inner wall of said inside chamber by utilizing the Marangoni effect.

12. The liquid processing method according to claim 9, wherein said third step is performed simultaneously with said second step.

13. The liquid processing method according to claim 9, wherein the cleaning processing of said inside chamber is performed after the batch processing of said plural substrates has been performed a predetermined number of times.

14. The liquid processing method according to claim 9, wherein said third step is periodically performed a predetermined time later.

15. The liquid processing method according to claim 9, wherein, when said liquid processing has not been performed, said third step is performed immediately before starting or restarting said liquid processing.

16. A liquid processing apparatus for performing a liquid processing by supplying a process liquid to the substrate, comprising:

a rotor for holding a plurality of substrates a predetermined distance apart from each other and in parallel;

a substantially cylindrical outside chamber capable of housing said rotor and fixed to a process position;

a substantially cylindrical inside chamber capable of housing said rotor, and capable of being housed in said outside chamber;

a cylindrical body capable of being housed in said inside chamber;

a process liquid spurting nozzle for spurting a process liquid onto the substrate held by said rotor;

a cleaning liquid spurting nozzle for spurting a cleaning liquid for cleaning said inside chamber;

a first sliding mechanism capable of sliding said inside chamber among said process position, said retreat position, and a maintenance position remoter than said retreat position from said process position;

a second sliding mechanism capable of sliding said cylindrical body between said retreat position and said maintenance position;

a first seal mechanism mounted to one edge surface of said outside chamber in a manner to seal the clearance between said inside chamber and said outside chamber; and a second seal mechanism mounted to an edge surface of said inside chamber in a manner to seal the clearance between said cylindrical body and said inside chamber;

wherein said inside chamber is slid between said process position and said maintenance position thereby being held at a predetermined position, and said cylindrical body is slid between said retreat position and said maintenance position thereby being held at a predetermined position, thereby gaining access easily to said first seal mechanism and said second seal mechanism.

17. The liquid processing apparatus according to claim 16, wherein said first and second seal mechanisms are air seal mechanisms each of which includes rubber tubes, which is expanded by air pressure.

* * * * *